(12) United States Patent
Lee et al.

(10) Patent No.: US 8,859,043 B2
(45) Date of Patent: *Oct. 14, 2014

(54) ORGANIC LAYER DEPOSITION APPARATUS AND METHOD OF MANUFACTURING ORGANIC LIGHT-EMITTING DISPLAY DEVICE BY USING THE SAME

(75) Inventors: Dong-Kyu Lee, Yongin (KR); Mu-Hyun Kim, Yongin (KR); Young-Rok Song, Yongin (KR); Sang-Pil Lee, Yongin (KR); Jung-Bae Song, Yongin (KR); Jong-Heon Kim, Yongin (KR); Byung-Su Kim, Yongin (KR); Yun-Mi Lee, Yongin (KR); Jae-Kwang Ryu, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 78 days.

This patent is subject to a terminal disclaimer.

(21) Appl. No.: 13/468,835

(22) Filed: May 10, 2012

(65) Prior Publication Data
US 2012/0299023 A1    Nov. 29, 2012

(30) Foreign Application Priority Data
May 25, 2011 (KR) .......................... 10-2011-0049792

(51) Int. Cl.
C23C 16/00 (2006.01)
H01L 33/08 (2010.01)
C23C 14/12 (2006.01)
C23C 14/04 (2006.01)
C23C 14/24 (2006.01)

(52) U.S. Cl.
CPC ............... *C23C 14/042* (2013.01); *C23C 14/12* (2013.01); *C23C 14/243* (2013.01)

USPC ........................................ 427/248.1; 118/715

(58) Field of Classification Search
None
See application file for complete search history.

(56) References Cited

U.S. PATENT DOCUMENTS

| 4,416,217 A | 11/1983 | Nakamura et al. |
| 4,468,648 A | 8/1984 | Uchikune |

(Continued)

FOREIGN PATENT DOCUMENTS

| CN | 1476279 A | 2/2004 |
| CN | 1489419 A | 4/2004 |

(Continued)

OTHER PUBLICATIONS

Patent Abstracts of Japan, and English machine translation of Japanese Publication 2001-052862, 20 pages.

(Continued)

*Primary Examiner* — Joseph Miller, Jr.
(74) *Attorney, Agent, or Firm* — Christie, Parker & Hale, LLP

(57) ABSTRACT

An organic layer deposition apparatus for forming an organic layer on a substrate includes: a deposition source configured to discharge a deposition material; a deposition source nozzle unit arranged at a side of the deposition source and including a plurality of deposition source nozzles; and a patterning slit sheet facing the deposition source nozzle unit and including a plurality of patterning slits and at least one spacer arranged between a pair of adjacent patterning slits of the plurality of patterning slits, the patterning slit sheet being smaller than the substrate in at least one of a first direction or a second direction perpendicular to the first direction, and the substrate is spaced apart from the organic layer deposition apparatus by a predetermined distance, and at least one of the substrate or the organic layer deposition apparatus is movable relative to the other.

9 Claims, 12 Drawing Sheets

(56) References Cited

U.S. PATENT DOCUMENTS

| | | |
|---|---|---|
| 4,687,939 A | 8/1987 | Miyauchi et al. |
| 4,792,378 A | 12/1988 | Rose et al. |
| 4,901,667 A | 2/1990 | Suzuki et al. |
| 5,454,847 A | 10/1995 | Jacoboni et al. |
| 5,460,654 A | 10/1995 | Kikkawa et al. |
| 5,487,609 A | 1/1996 | Asada |
| 5,742,129 A | 4/1998 | Nagayama et al. |
| 5,909,995 A | 6/1999 | Wolf et al. |
| 6,045,671 A | 4/2000 | Wu et al. |
| 6,091,195 A | 7/2000 | Forrest et al. |
| 6,099,649 A | 8/2000 | Schmitt et al. |
| 6,274,198 B1 | 8/2001 | Dautartas |
| 6,280,821 B1 | 8/2001 | Kadunce et al. |
| 6,371,451 B1 | 4/2002 | Choi |
| 6,417,034 B2 | 7/2002 | Kitazume et al. |
| 6,443,597 B1 | 9/2002 | Natori |
| 6,483,690 B1 | 11/2002 | Nakajima et al. |
| 6,541,130 B2 | 4/2003 | Fukuda |
| 6,554,969 B1 | 4/2003 | Chong |
| 6,579,422 B1 | 6/2003 | Kakinuma |
| 6,589,673 B1 | 7/2003 | Kido et al. |
| 6,650,023 B2 | 11/2003 | Kim |
| 6,699,324 B1 | 3/2004 | Berdin et al. |
| 6,749,906 B2 | 6/2004 | Van Slyke |
| 6,776,847 B2 | 8/2004 | Yamazaki et al. |
| 6,837,939 B1 | 1/2005 | Klug et al. |
| 6,878,209 B2 | 4/2005 | Himeshima et al. |
| 6,946,783 B2 | 9/2005 | Kim |
| 6,995,035 B2 | 2/2006 | Cok et al. |
| 7,006,202 B2 | 2/2006 | Byun et al. |
| RE39,024 E | 3/2006 | Takahashi |
| 7,078,070 B2 | 7/2006 | Peng |
| 7,199,520 B2 | 4/2007 | Fujii et al. |
| 7,282,855 B2 | 10/2007 | Park et al. |
| 7,322,248 B1 | 1/2008 | Long et al. |
| 7,495,389 B2 | 2/2009 | Noguchi et al. |
| 7,601,439 B2 | 10/2009 | Chun et al. |
| 7,776,457 B2 | 8/2010 | Lee et al. |
| 7,872,256 B2 | 1/2011 | Sung et al. |
| 7,910,386 B2 | 3/2011 | Shiang et al. |
| 7,964,037 B2 | 6/2011 | Fukuda et al. |
| 8,022,448 B1 | 9/2011 | Luu et al. |
| 8,128,753 B2 | 3/2012 | Bulovic et al. |
| 8,137,466 B2 | 3/2012 | Kang et al. |
| 8,188,476 B2 | 5/2012 | Takagi et al. |
| 8,193,011 B2 | 6/2012 | Kang et al. |
| 2001/0004186 A1 | 6/2001 | Song et al. |
| 2001/0006827 A1 | 7/2001 | Yamazaki et al. |
| 2001/0019807 A1 | 9/2001 | Yamada et al. |
| 2001/0026638 A1 | 10/2001 | Sangu et al. |
| 2001/0034175 A1 | 10/2001 | Miyazaki et al. |
| 2002/0011785 A1 | 1/2002 | Tang et al. |
| 2002/0017245 A1 | 2/2002 | Tsubaki et al. |
| 2002/0033136 A1 | 3/2002 | Savage et al. |
| 2002/0036759 A1 | 3/2002 | Ise et al. |
| 2002/0050061 A1 | 5/2002 | Komyoji et al. |
| 2002/0076847 A1 | 6/2002 | Yamada et al. |
| 2002/0168577 A1 | 11/2002 | Yoon |
| 2002/0179013 A1 | 12/2002 | Kido et al. |
| 2002/0187253 A1 | 12/2002 | Marcus et al. |
| 2002/0194727 A1 | 12/2002 | Cho et al. |
| 2002/0197393 A1 | 12/2002 | Kuwabara |
| 2003/0021886 A1 | 1/2003 | Baele |
| 2003/0101932 A1 | 6/2003 | Kang |
| 2003/0101937 A1 | 6/2003 | Van Slyke et al. |
| 2003/0117602 A1 | 6/2003 | Kobayashi et al. |
| 2003/0118950 A1 | 6/2003 | Chao et al. |
| 2003/0124764 A1 | 7/2003 | Yamazaki et al. |
| 2003/0151637 A1 | 8/2003 | Nakamura et al. |
| 2003/0164934 A1 | 9/2003 | Nishi et al. |
| 2003/0168013 A1 | 9/2003 | Freeman et al. |
| 2003/0173896 A1 | 9/2003 | Grushin et al. |
| 2003/0221614 A1 | 12/2003 | Kang et al. |
| 2003/0221620 A1 | 12/2003 | Yamazaki |
| 2003/0232563 A1 | 12/2003 | Kamiyama et al. |
| 2004/0016907 A1 | 1/2004 | Shi |
| 2004/0029028 A1 | 2/2004 | Shimizu |
| 2004/0056244 A1 | 3/2004 | Marcus et al. |
| 2004/0086639 A1 | 5/2004 | Grantham et al. |
| 2004/0096771 A1 | 5/2004 | Kashiwagi et al. |
| 2004/0115338 A1 | 6/2004 | Yoneda |
| 2004/0115342 A1 | 6/2004 | Shigemura |
| 2004/0123804 A1 | 7/2004 | Yamazaki et al. |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0157167 A1 | 8/2004 | Morii |
| 2004/0183435 A1 | 9/2004 | Ohshita |
| 2004/0194702 A1 | 10/2004 | Sasaki et al. |
| 2004/0195530 A1 | 10/2004 | Kwak et al. |
| 2004/0216673 A1 | 11/2004 | Sakata et al. |
| 2004/0255857 A1 | 12/2004 | Chow et al. |
| 2004/0263547 A1 | 12/2004 | Sugahara |
| 2004/0263771 A1 | 12/2004 | Jeong et al. |
| 2005/0001546 A1 | 1/2005 | Yamaguchi |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0039684 A1 | 2/2005 | Yi et al. |
| 2005/0072359 A1 | 4/2005 | Kim |
| 2005/0072361 A1 | 4/2005 | Yang et al. |
| 2005/0079418 A1 | 4/2005 | Kelley et al. |
| 2005/0110400 A1 | 5/2005 | Nakamura |
| 2005/0129489 A1 | 6/2005 | Quan et al. |
| 2005/0153472 A1 | 7/2005 | Yotsuya |
| 2005/0166842 A1 | 8/2005 | Sakamoto |
| 2005/0166844 A1 | 8/2005 | Gralenski |
| 2005/0183670 A1 | 8/2005 | Grantham et al. |
| 2005/0186330 A1 | 8/2005 | Kim et al. |
| 2005/0213021 A1 | 9/2005 | Myoung |
| 2005/0217584 A1 | 10/2005 | Abiko et al. |
| 2005/0229848 A1 | 10/2005 | Shinriki et al. |
| 2005/0244580 A1 | 11/2005 | Cok et al. |
| 2005/0263074 A1 | 12/2005 | Masuda et al. |
| 2006/0011136 A1 | 1/2006 | Yamazaki et al. |
| 2006/0012771 A1 | 1/2006 | Jeong |
| 2006/0022590 A1 | 2/2006 | Aziz et al. |
| 2006/0040132 A1 | 2/2006 | Liao et al. |
| 2006/0045958 A1 | 3/2006 | Abiko et al. |
| 2006/0066231 A1 | 3/2006 | Nishikawa et al. |
| 2006/0090705 A1 | 5/2006 | Kim |
| 2006/0102078 A1 | 5/2006 | Fairbairn et al. |
| 2006/0110544 A1 | 5/2006 | Kim et al. |
| 2006/0113907 A1 | 6/2006 | Im et al. |
| 2006/0115585 A1 | 6/2006 | Bulovic et al. |
| 2006/0130766 A1 | 6/2006 | Kim et al. |
| 2006/0144325 A1 | 7/2006 | Jung et al. |
| 2006/0152641 A1 | 7/2006 | Brody |
| 2006/0164786 A1 | 7/2006 | Kobayashi et al. |
| 2006/0169211 A1 | 8/2006 | Kim et al. |
| 2006/0174829 A1 | 8/2006 | An et al. |
| 2006/0205101 A1 | 9/2006 | Lee et al. |
| 2006/0244696 A1 | 11/2006 | Jung et al. |
| 2006/0267294 A1 | 11/2006 | Busse et al. |
| 2006/0269671 A1 | 11/2006 | Kim et al. |
| 2006/0272572 A1 | 12/2006 | Uematsu et al. |
| 2006/0278522 A1 | 12/2006 | Kim et al. |
| 2006/0278945 A1 | 12/2006 | Sakurai |
| 2006/0280588 A1 | 12/2006 | Blonigan et al. |
| 2007/0009552 A1 | 1/2007 | Whitehead et al. |
| 2007/0009652 A1 | 1/2007 | Manz et al. |
| 2007/0017445 A1 | 1/2007 | Takehara et al. |
| 2007/0022955 A1 | 2/2007 | Bender et al. |
| 2007/0024185 A1 | 2/2007 | Kitamura et al. |
| 2007/0046185 A1 | 3/2007 | Kim |
| 2007/0046913 A1 | 3/2007 | Shibazaki |
| 2007/0054044 A1 | 3/2007 | Shimosaki et al. |
| 2007/0075955 A1 | 4/2007 | Jung et al. |
| 2007/0077358 A1 | 4/2007 | Jeong et al. |
| 2007/0148337 A1 | 6/2007 | Nichols et al. |
| 2007/0148348 A1 | 6/2007 | Huh et al. |
| 2007/0157879 A1 | 7/2007 | Yotsuya |
| 2007/0158471 A1 | 7/2007 | Park et al. |

(56) References Cited

U.S. PATENT DOCUMENTS

| | | |
|---|---|---|
| 2007/0163497 A1 | 7/2007 | Grace et al. |
| 2007/0178708 A1 | 8/2007 | Ukigaya |
| 2007/0190235 A1 | 8/2007 | Yamazaki et al. |
| 2007/0195844 A1 | 8/2007 | Ma et al. |
| 2007/0231460 A1 | 10/2007 | Ukigaya |
| 2007/0275497 A1 | 11/2007 | Kwack et al. |
| 2007/0297887 A1 | 12/2007 | Tanaka |
| 2008/0018236 A1* | 1/2008 | Arai et al. ............ 313/504 |
| 2008/0038935 A1 | 2/2008 | Baude et al. |
| 2008/0057183 A1 | 3/2008 | Spindler et al. |
| 2008/0100204 A1 | 5/2008 | Kim |
| 2008/0115729 A1 | 5/2008 | Oda et al. |
| 2008/0118743 A1 | 5/2008 | Lee et al. |
| 2008/0129194 A1 | 6/2008 | Abe et al. |
| 2008/0131587 A1 | 6/2008 | Boroson et al. |
| 2008/0145521 A1 | 6/2008 | Guo et al. |
| 2008/0174235 A1 | 7/2008 | Kim et al. |
| 2008/0216741 A1 | 9/2008 | Ling et al. |
| 2008/0238294 A1 | 10/2008 | Xu et al. |
| 2008/0251785 A1 | 10/2008 | Noh et al. |
| 2008/0286461 A1 | 11/2008 | Noguchi et al. |
| 2008/0298947 A1 | 12/2008 | Yeo et al. |
| 2008/0309718 A1 | 12/2008 | Oya et al. |
| 2009/0001882 A1 | 1/2009 | Park et al. |
| 2009/0014412 A1 | 1/2009 | Nozawa et al. |
| 2009/0017192 A1 | 1/2009 | Matsuura |
| 2009/0124033 A1 | 5/2009 | Moriyama |
| 2009/0133629 A1 | 5/2009 | Kamikawa et al. |
| 2009/0153033 A1 | 6/2009 | Lee et al. |
| 2009/0165713 A1 | 7/2009 | Kim et al. |
| 2009/0169868 A1 | 7/2009 | Haglund, Jr. et al. |
| 2009/0170230 A1 | 7/2009 | Kidu et al. |
| 2009/0181163 A1 | 7/2009 | Uetake |
| 2009/0208754 A1 | 8/2009 | Chu et al. |
| 2009/0220691 A1 | 9/2009 | Kim |
| 2009/0229524 A1 | 9/2009 | Kim et al. |
| 2009/0232976 A1 | 9/2009 | Yoon et al. |
| 2009/0269881 A1 | 10/2009 | Furuta et al. |
| 2009/0277386 A1 | 11/2009 | Takagi et al. |
| 2009/0279173 A1 | 11/2009 | Chui et al. |
| 2009/0302750 A1 | 12/2009 | Jun et al. |
| 2009/0304906 A1 | 12/2009 | Suduo et al. |
| 2009/0304924 A1 | 12/2009 | Gadgil |
| 2009/0308317 A1 | 12/2009 | Sone et al. |
| 2009/0315456 A1 | 12/2009 | Furukawa et al. |
| 2010/0001301 A1 | 1/2010 | Karg et al. |
| 2010/0055810 A1 | 3/2010 | Sung et al. |
| 2010/0086672 A1 | 4/2010 | Von Drasek et al. |
| 2010/0089443 A1 | 4/2010 | Bloomstein et al. |
| 2010/0090594 A1 | 4/2010 | Choi et al. |
| 2010/0130020 A1 | 5/2010 | Kim et al. |
| 2010/0156279 A1 | 6/2010 | Tamura et al. |
| 2010/0165454 A1 | 7/2010 | Suetsugu et al. |
| 2010/0170439 A1 | 7/2010 | Negishi |
| 2010/0192856 A1 | 8/2010 | Sung et al. |
| 2010/0196607 A1 | 8/2010 | Carlson et al. |
| 2010/0255198 A1 | 10/2010 | Cleary et al. |
| 2010/0271602 A1 | 10/2010 | Hanazaki |
| 2010/0275842 A1 | 11/2010 | Park et al. |
| 2010/0297348 A1 | 11/2010 | Lee et al. |
| 2010/0297349 A1 | 11/2010 | Lee et al. |
| 2010/0310768 A1 | 12/2010 | Lee et al. |
| 2010/0328197 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0042659 A1 | 2/2011 | Kim et al. |
| 2011/0045617 A1 | 2/2011 | Kang et al. |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0053300 A1 | 3/2011 | Ryu et al. |
| 2011/0068331 A1 | 3/2011 | Koh et al. |
| 2011/0123707 A1 | 5/2011 | Lee et al. |
| 2011/0139069 A1* | 6/2011 | Ahn et al. ............ 118/504 |
| 2011/0165327 A1 | 7/2011 | Park et al. |
| 2011/0168986 A1 | 7/2011 | Lee et al. |
| 2011/0220019 A1* | 9/2011 | Lee et al. ............ 118/504 |
| 2011/0241438 A1 | 10/2011 | Kim et al. |
| 2011/0262625 A1 | 10/2011 | Park et al. |
| 2011/0266944 A1 | 11/2011 | Song et al. |
| 2012/0009328 A1 | 1/2012 | Ryu et al. |
| 2012/0009332 A1 | 1/2012 | Kim et al. |
| 2012/0009706 A1 | 1/2012 | Choi et al. |
| 2012/0028390 A1 | 2/2012 | Lee et al. |
| 2012/0068199 A1 | 3/2012 | Sung et al. |
| 2012/0068201 A1 | 3/2012 | Sung et al. |
| 2012/0070928 A1 | 3/2012 | Kim et al. |
| 2012/0083061 A1 | 4/2012 | Kang et al. |
| 2012/0097992 A1 | 4/2012 | Jeong |
| 2012/0100282 A1 | 4/2012 | Lee et al. |
| 2012/0103253 A1 | 5/2012 | Park et al. |
| 2012/0132137 A1 | 5/2012 | Oh et al. |
| 2012/0145077 A1 | 6/2012 | Chang et al. |
| 2012/0148743 A1 | 6/2012 | Bulovic et al. |
| 2012/0174865 A1 | 7/2012 | Choi et al. |
| 2012/0175605 A1 | 7/2012 | Shin et al. |
| 2012/0183676 A1 | 7/2012 | Sonoda et al. |
| 2012/0214263 A1 | 8/2012 | Yamazaki et al. |
| 2012/0299016 A1 | 11/2012 | Choi |
| 2012/0299023 A1 | 11/2012 | Lee et al. |
| 2012/0299024 A1 | 11/2012 | Lee et al. |
| 2012/0301614 A1 | 11/2012 | Choi et al. |
| 2012/0301986 A1 | 11/2012 | Choi et al. |
| 2012/0313251 A1 | 12/2012 | Kato |
| 2013/0001528 A1 | 1/2013 | Chang et al. |
| 2013/0008379 A1 | 1/2013 | Chang et al. |
| 2013/0032829 A1 | 2/2013 | Sung et al. |
| 2013/0157016 A1 | 6/2013 | Kim |
| 2013/0217164 A1 | 8/2013 | Kang et al. |
| 2013/0291796 A1 | 11/2013 | Inoue et al. |
| 2013/0298829 A1 | 11/2013 | Jo et al. |
| 2013/0341598 A1 | 12/2013 | Chang et al. |
| 2014/0010957 A1 | 1/2014 | Inoue et al. |
| 2014/0014917 A1 | 1/2014 | Lee et al. |
| 2014/0014918 A1 | 1/2014 | Han |
| 2014/0014920 A1 | 1/2014 | Lee |
| 2014/0014921 A1 | 1/2014 | Choi |
| 2014/0014924 A1 | 1/2014 | Oh et al. |
| 2014/0014929 A1 | 1/2014 | Lee et al. |

FOREIGN PATENT DOCUMENTS

| | | |
|---|---|---|
| CN | 1500904 A | 6/2004 |
| CN | 1556872 A | 12/2004 |
| CN | 1607868 A | 4/2005 |
| CN | 1682569 A | 10/2005 |
| CN | 1704501 A | 12/2005 |
| CN | 1814854 A | 8/2006 |
| CN | 1841696 A | 10/2006 |
| EP | 1 413 644 A2 | 4/2004 |
| EP | 1 418 250 A2 | 5/2004 |
| EP | 1 518 940 A1 | 3/2005 |
| EP | 2354270 A1 | 8/2011 |
| JP | 57-194252 A2 | 11/1982 |
| JP | 2-247372 | 10/1990 |
| JP | 04-272170 | 9/1992 |
| JP | 5-22405 U1 | 3/1993 |
| JP | 5-98425 A2 | 4/1993 |
| JP | 5-230628 A2 | 9/1993 |
| JP | 8-27568 A2 | 1/1996 |
| JP | 9-95776 A2 | 4/1997 |
| JP | 10-50478 | 2/1998 |
| JP | 10-120171 | 5/1998 |
| JP | 10-270535 | 10/1998 |
| JP | 11-144865 | 5/1999 |
| JP | 2000-068054 | 3/2000 |
| JP | 2000-282219 | 10/2000 |
| JP | 2000-323277 | 11/2000 |
| JP | 2001-28325 A2 | 1/2001 |
| JP | 2001-052862 | 2/2001 |
| JP | 2001-093667 | 4/2001 |

(56) References Cited

FOREIGN PATENT DOCUMENTS

| | | |
|---|---|---|
| JP | 2002-75638 A2 | 3/2002 |
| JP | 2002-175878 | 6/2002 |
| JP | 2002-348659 A2 | 12/2002 |
| JP | 2003-003250 | 1/2003 |
| JP | 2003-077662 | 3/2003 |
| JP | 2003-157973 | 5/2003 |
| JP | 2003-197531 A2 | 7/2003 |
| JP | 2003-297562 | 10/2003 |
| JP | 2003-321767 | 11/2003 |
| JP | 2003-347394 A2 | 12/2003 |
| JP | 2004-035964 A2 | 2/2004 |
| JP | 2004-043898 | 2/2004 |
| JP | 2004-76150 A2 | 3/2004 |
| JP | 2004-91858 A2 | 3/2004 |
| JP | 2004-103269 | 4/2004 |
| JP | 2004-103341 | 4/2004 |
| JP | 2004-107764 A2 | 4/2004 |
| JP | 2004-137583 A2 | 5/2004 |
| JP | 2004-143521 A2 | 5/2004 |
| JP | 2004-169169 A2 | 6/2004 |
| JP | 2004-199919 | 7/2004 |
| JP | 2004-225058 | 8/2004 |
| JP | 2004-342455 A2 | 12/2004 |
| JP | 2004-349101 | 12/2004 |
| JP | 2004-355975 | 12/2004 |
| JP | 2005-044592 | 2/2005 |
| JP | 2005-101505 | 4/2005 |
| JP | 2005-122980 A | 5/2005 |
| JP | 2005-165015 A2 | 6/2005 |
| JP | 2005-174843 A2 | 6/2005 |
| JP | 2005-206939 A2 | 8/2005 |
| JP | 2005-213616 A2 | 8/2005 |
| JP | 2005-235568 | 9/2005 |
| JP | 2005-293968 | 10/2005 |
| JP | 2005-296737 | 10/2005 |
| JP | 2006-28583 A2 | 2/2006 |
| JP | 2006-172930 A2 | 6/2006 |
| JP | 2006-176809 A2 | 7/2006 |
| JP | 2006-210038 A2 | 8/2006 |
| JP | 2006-219760 | 8/2006 |
| JP | 2006-275433 | 10/2006 |
| JP | 2006-292955 A2 | 10/2006 |
| JP | 2006-307247 A2 | 11/2006 |
| JP | 2007-047293 | 2/2007 |
| JP | 2007-66862 | 3/2007 |
| JP | 2007-146219 | 6/2007 |
| JP | 2007-157886 | 6/2007 |
| JP | 2007-186740 | 7/2007 |
| JP | 2007-186740 A2 | 7/2007 |
| JP | 2007-242436 | 9/2007 |
| JP | 2007-291506 A2 | 11/2007 |
| JP | 2008-19477 A2 | 1/2008 |
| JP | 2008-108628 | 5/2008 |
| JP | 2008-121098 | 5/2008 |
| JP | 2008-521165 A | 6/2008 |
| JP | 2008-196003 | 8/2008 |
| JP | 2008-248301 A2 | 10/2008 |
| JP | 2008-300056 | 12/2008 |
| JP | 2009-019243 | 1/2009 |
| JP | 2009-24208 A2 | 2/2009 |
| JP | 2009-049223 | 3/2009 |
| JP | 2009-81165 A2 | 4/2009 |
| JP | 2009-87910 | 4/2009 |
| JP | 2009-117231 A2 | 5/2009 |
| JP | 2010-159167 A2 | 7/2010 |
| JP | 2010-261081 A2 | 11/2010 |
| JP | 2011-47035 | 3/2011 |
| JP | 2011-146377 | 7/2011 |
| JP | 2012-92448 | 5/2012 |
| JP | 2012-211352 | 11/2012 |
| KR | 1997-0008709 A | 2/1997 |
| KR | 10-0257219 B1 | 2/2000 |
| KR | 10-2000-0019254 | 4/2000 |
| KR | 10-2000-0023929 | 5/2000 |
| KR | 2001-0024652 | 3/2001 |
| KR | 2001-0030175 A | 4/2001 |
| KR | 10-2001-0039298 A | 5/2001 |
| KR | 10-2001-0059939 | 7/2001 |
| KR | 10-2001-0092914 A | 10/2001 |
| KR | 2001-0093666 A | 10/2001 |
| KR | 20-0257218 | 11/2001 |
| KR | 10-2002-0000201 | 1/2002 |
| KR | 2002-0001555 | 1/2002 |
| KR | 10-2002-0050922 | 6/2002 |
| KR | 10-2002-0090934 | 12/2002 |
| KR | 10-2002-0091457 A | 12/2002 |
| KR | 10-2003-0001745 | 1/2003 |
| KR | 2003-0034730 A | 5/2003 |
| KR | 10-2003-0043012 A | 6/2003 |
| KR | 2003-0046090 | 6/2003 |
| KR | 2003-0069684 A | 8/2003 |
| KR | 10-0405080 B1 | 11/2003 |
| KR | 10-0406059 B1 | 11/2003 |
| KR | 10-2003-0091947 | 12/2003 |
| KR | 10-2003-0093959 | 12/2003 |
| KR | 2003-0094033 A | 12/2003 |
| KR | 10-2004-0014258 A | 2/2004 |
| KR | 20-0342433 Y1 | 2/2004 |
| KR | 10-2004-0034537 | 4/2004 |
| KR | 10-2004-0039910 A | 5/2004 |
| KR | 10-0430336 B1 | 5/2004 |
| KR | 10-2004-0050045 | 6/2004 |
| KR | 10-2004-0069281 | 8/2004 |
| KR | 10-2004-0084747 | 10/2004 |
| KR | 10-2004-0087142 A | 10/2004 |
| KR | 10-2004-0110718 A | 12/2004 |
| KR | 10-0463212 B1 | 12/2004 |
| KR | 10-2005-0018234 A | 2/2005 |
| KR | 10-2005-0024324 A | 3/2005 |
| KR | 10-2005-0028943 | 3/2005 |
| KR | 10-2005-0039140 A | 4/2005 |
| KR | 10-0483487 B1 | 4/2005 |
| KR | 10-2005-0062853 A | 6/2005 |
| KR | 10-2005-0082644 A | 8/2005 |
| KR | 10-0520159 B1 | 10/2005 |
| KR | 10-0532657 B1 | 12/2005 |
| KR | 10-2006-0008602 | 1/2006 |
| KR | 10-2006-0018745 | 3/2006 |
| KR | 10-2006-0020050 | 3/2006 |
| KR | 10-2006-0045225 A | 5/2006 |
| KR | 10-2006-0049050 | 5/2006 |
| KR | 10-2006-0051746 A | 5/2006 |
| KR | 10-2006-0053926 A | 5/2006 |
| KR | 10-2006-0056706 | 5/2006 |
| KR | 10-2006-0058459 | 5/2006 |
| KR | 10-2009-0052828 A | 5/2006 |
| KR | 10-2006-0059068 | 6/2006 |
| KR | 10-2006-0059323 A | 6/2006 |
| KR | 10-2006-0060994 | 6/2006 |
| KR | 10-2006-0065978 | 6/2006 |
| KR | 10-2006-0073367 | 6/2006 |
| KR | 10-2006-0077887 A | 7/2006 |
| KR | 10-2006-0080475 | 7/2006 |
| KR | 10-2006-0080481 | 7/2006 |
| KR | 10-2006-0080482 | 7/2006 |
| KR | 10-2006-0081943 A | 7/2006 |
| KR | 10-2006-0083510 | 7/2006 |
| KR | 10-2006-0092387 | 8/2006 |
| KR | 10-2006-0098755 | 9/2006 |
| KR | 10-2006-0104288 A | 10/2006 |
| KR | 10-2006-0104675 | 10/2006 |
| KR | 10-2006-0104677 | 10/2006 |
| KR | 10-2006-0109627 | 10/2006 |
| KR | 10-0635903 | 10/2006 |
| KR | 10-2006-0114462 A | 11/2006 |
| KR | 10-2006-0114477 A | 11/2006 |
| KR | 10-2006-0114573 A | 11/2006 |
| KR | 10-0645719 | 11/2006 |
| KR | 10-0646160 B1 | 11/2006 |
| KR | 10-2006-0123944 A | 12/2006 |
| KR | 10-0687007 B1 | 2/2007 |
| KR | 10-2007-0025164 | 3/2007 |
| KR | 10-0696547 B1 | 3/2007 |
| KR | 10-0696550 B1 | 3/2007 |

(56) References Cited

FOREIGN PATENT DOCUMENTS

| KR | 10-0697663 | | 3/2007 |
|---|---|---|---|
| KR | 10-0698033 | B1 | 3/2007 |
| KR | 10-0700466 | B1 | 3/2007 |
| KR | 10-2007-0035796 | | 4/2007 |
| KR | 10-2007-0037848 | A | 4/2007 |
| KR | 10-0711885 | B1 | 4/2007 |
| KR | 10-2007-0050793 | | 5/2007 |
| KR | 10-0723627 | B1 | 5/2007 |
| KR | 10-2007-0056190 | A | 6/2007 |
| KR | 10-0726132 | B1 | 6/2007 |
| KR | 10-0736218 | B1 | 7/2007 |
| KR | 10-0739309 | | 7/2007 |
| KR | 10-0741142 | B1 | 7/2007 |
| KR | 10-2007-0078713 | | 8/2007 |
| KR | 10-2007-0080635 | | 8/2007 |
| KR | 10-2007-0091437 | A | 9/2007 |
| KR | 10-2006-0028115 | | 10/2007 |
| KR | 10-2007-0097218 | | 10/2007 |
| KR | 10-2007-0098122 | A | 10/2007 |
| KR | 10-2007-0101842 | | 10/2007 |
| KR | 10-2007-0105595 | | 10/2007 |
| KR | 10-0768212 | B1 | 10/2007 |
| KR | 10-0770653 | B1 | 10/2007 |
| KR | 10-2007-0112668 | | 11/2007 |
| KR | 10-2007-0114094 | A | 11/2007 |
| KR | 10-0787457 | B1 | 12/2007 |
| KR | 10-2008-0001184 | | 1/2008 |
| KR | 10-2008-0003720 | A | 1/2008 |
| KR | 10-2008-007896 | A | 1/2008 |
| KR | 10-2008-0009285 | A | 1/2008 |
| KR | 10-0797787 | B1 | 1/2008 |
| KR | 10-0800125 | | 1/2008 |
| KR | 10-0815265 | | 3/2008 |
| KR | 10-2008-036983 | A | 4/2008 |
| KR | 10-0823508 | B1 | 4/2008 |
| KR | 10-0823511 | B1 | 4/2008 |
| KR | 10-2008-0044239 | A | 5/2008 |
| KR | 10-2008-0044775 | A | 5/2008 |
| KR | 10-2008-0046761 | A | 5/2008 |
| KR | 10-0827760 | B1 | 5/2008 |
| KR | 10-2008-0048653 | | 6/2008 |
| KR | 10-2008-0055124 | A | 6/2008 |
| KR | 10-2008-0057159 | A | 6/2008 |
| KR | 10-0839380 | B1 | 6/2008 |
| KR | 10-2008-0060400 | | 7/2008 |
| KR | 10-2008-0061132 | | 7/2008 |
| KR | 10-2008-0061666 | A | 7/2008 |
| KR | 10-2008-0061774 | A | 7/2008 |
| KR | 10-2008-0062212 | | 7/2008 |
| KR | 10-0899279 | B1 | 7/2008 |
| KR | 10-2008-0076574 | A | 8/2008 |
| KR | 10-2008-0088737 | A | 10/2008 |
| KR | 10-2008-0104479 | | 12/2008 |
| KR | 10-2008-0104695 | A | 12/2008 |
| KR | 10-2008-0109559 | A | 12/2008 |
| KR | 10-2009-0017910 | A | 2/2009 |
| KR | 10-0889872 | B1 | 3/2009 |
| KR | 10-2009-0038733 | | 4/2009 |
| KR | 10-2009-0040618 | A | 4/2009 |
| KR | 10-2009-0047953 | A | 5/2009 |
| KR | 10-2009-0052155 | | 5/2009 |
| KR | 10-2009-0053417 | A | 5/2009 |
| KR | 10-2009-0066996 | A | 6/2009 |
| KR | 10-2009-0075887 | A | 7/2009 |
| KR | 10-2009-0079765 | A | 7/2009 |
| KR | 10-2009-0081717 | A | 7/2009 |
| KR | 10-0908232 | B1 | 7/2009 |
| KR | 10-2009-0093161 | | 9/2009 |
| KR | 10-2009-0094911 | A | 9/2009 |
| KR | 10-2009-0097453 | | 9/2009 |
| KR | 10-2009-0107702 | | 10/2009 |
| KR | 10-0922763 | A | 10/2009 |
| KR | 10-2010-0000128 | | 1/2010 |
| KR | 10-2010-0000129 | A | 1/2010 |
| KR | 10-2010-0002381 | A | 1/2010 |
| KR | 10-2010-0026655 | | 3/2010 |
| KR | 10-2010-0038088 | A | 4/2010 |
| KR | 10-2010-0044606 | A | 4/2010 |
| KR | 10-2010-0047796 | | 5/2010 |
| KR | 10-0961110 | B1 | 6/2010 |
| KR | 10-2010-0090070 | A | 8/2010 |
| KR | 10-2010-0099806 | A | 9/2010 |
| KR | 10-2010-0119368 | A | 11/2010 |
| KR | 10-2010-0126125 | A | 12/2010 |
| KR | 10-2010-0128589 | A | 12/2010 |
| KR | 10-2010-0130786 | A | 12/2010 |
| KR | 10-2010-0133678 | A | 12/2010 |
| KR | 10-2010-0138139 | A | 12/2010 |
| KR | 10-1017654 | B1 | 2/2011 |
| KR | 10-2011-0021090 | A | 3/2011 |
| KR | 10-2011-0022512 | A | 3/2011 |
| KR | 10-2011-0032589 | A | 3/2011 |
| KR | 10-2011-0082418 | A | 7/2011 |
| KR | 10-2011-0101767 | A | 9/2011 |
| KR | 10-2011-0110525 | A | 10/2011 |
| KR | 10-2011-0120213 | A | 11/2011 |
| KR | 10-2011-0138787 | A | 12/2011 |
| KR | 10-2012-0006322 | A | 1/2012 |
| KR | 10-2012-0006324 | A | 1/2012 |
| KR | 10-2012-0012300 | | 2/2012 |
| KR | 10-2012-0042155 | A | 5/2012 |
| KR | 10-2012-0065789 | A | 6/2012 |
| KR | 10-2012-0080855 | A | 7/2012 |
| KR | 10-2012-0081811 | A | 7/2012 |
| KR | 10-1193186 | B1 | 10/2012 |
| KR | 10-2012-0131545 | A | 12/2012 |
| KR | 10-2013-0007308 | A | 1/2013 |
| WO | WO99/25894 | | 5/1999 |
| WO | 03043067 | A1 | 5/2003 |
| WO | WO2004016406 | A1 | 2/2004 |
| WO | 2008004792 | A1 | 1/2008 |

OTHER PUBLICATIONS

Patent Abstracts of Japan, and English machine translation of Japanese Publication 2003-003250, 25 pages.
Korean Patent Abstracts, Publication No. 1020020086047, dated Nov. 18, 2002, for corresponding Korean Patent 10-0405080 listed above.
Korean Patent Abstracts, Publication No. 1020020088662, dated Nov. 29, 2002, for corresponding Korean Patent 10-0463212 listed above.
Korean Patent Abstracts, Publication No. 1020050045619, dated May 17, 2005, for corresponding Korean Patent 10-0520159 listed above.
Korean Patent Abstracts, Publication No. 1020040062203, dated Jul. 7, 2004, for corresponding Korean Patent 10-0646160 listed above.
Korean Patent Abstracts, Publication No. 1020060101987, dated Sep. 27, 2006, for corresponding Korean Patent 10-0687007 listed above.
Korean Patent Abstracts, Publication No. 1020020056238, dated Jul. 10, 2002, for corresponding Korean Patent 10-0698033 listed above.
Korean Patent Abstracts, Publication No. 1020050078637, dated Aug. 5, 2005, for corresponding Korean Patent 10-0700466 listed above.
Korean Patent Abstracts, Publication No. 1020070025164, dated Mar. 8, 2007, for corresponding Korean Patent 10-0711885 listed above.
Korean Patent Abstracts, Publication No. 1020020034272, dated May 9, 2002, for corresponding Korean Patent 10-0726132 listed above.
Korean Patent Abstracts, Publication No. 1020060126267, dated Dec. 7, 2006, for corresponding Korean Patent 10-0797787 listed above.
Korean Patent Abstracts, Publication No. 1020010062735, dated Jul. 7, 2001, for corresponding Korean Patent 10-0827760 listed above.
Korean Patent Abstracts, Publication No. 1020080038650, dated May 7, 2008, for corresponding Korean Patent 10-0839380 listed above.
Korean Patent Abstracts, Publication No. 1020070050793, dated May 16, 2007, for corresponding Korean Patent 10-0815265 listed above.

(56) References Cited

OTHER PUBLICATIONS

Korean Patent Abstracts, Publication No. 102000-0019254 dated Apr. 6, 2000, for corresponding Korean Patent No. 10-2007-0101842 listed above.
English Abstract, Publication No. KR20080002189 dated Jan. 4, 2008, for corresponding Korean Patent 10-0800125 listed above.
Korean Notice of Allowance dated Nov. 25, 2011 for Korean Patent Application No. 10-2010-0014277, 5 pages.
Korean Notice of Allowance dated Sep. 28, 2011 for Korean Patent Application No. 10-2009-0042357, 5 pages.
Korean Notice of Allowance dated Jan. 13, 2012 for Korean Patent Application No. 10-2009-0056529, 5 pages.
Korean Office action dated Feb. 1, 2012 for Korean Application No. 10-2010-0011196, 4 pages.
Korean Office action dated Feb. 1, 2012 for Korean Application No. 10-2010-0013848, 3 pages.
European Search Report dated May 13, 2011 for European Application No. 11250019.4 (6 pages).
European Search Report dated May 20, 2011 for European Application No. 10251404.9 (12 pages).
European Search Report dated May 27, 2011 for European Application No. 10251514.5 (11 pages).
European Search Report dated Sep. 6, 2010 for European Application No. 10250962.7 (5 pages).
Japanese Patent Office Action dated Jan. 22, 2013 for Japanese Application No. 2010-116470, (3 pages).
Japanese Patent Office Action dated Jan. 8, 2013 for Japanese Application No. 2011-000180 (3 pages).
Japanese Patent Office Action dated Mar. 19, 2013 for Japanese Application No. 2011-097909, (3 pages).
JP Office action dated Aug. 21, 2012, issued to JP Application No. 2010-145075 (5 pages).
JP Office action dated Sep. 4, 2012, issued to JP Application No. 2010-152846 (4 pages).
JPO Office action dated Apr. 1, 2014, for Japanese Patent application 2010-286245 (4 pages).
JPO Office action dated Feb. 25, 2014, for corresponding Japanese Patent application 2013-128405 (3 pages).
JPO Office action dated Jan. 28, 2014, for corresponding Japanese Patent application 2011-097909 (4 pages).
KIPO Notice of Allowance dated Apr. 26, 2012 for Korean Application No. 10-2010-0066991 (5 pages).
KIPO Notice of Allowance dated Apr. 30, 2012, issued to KR 10-2010-0066992 (5 pages).
KIPO Notice of Allowance dated Aug. 24, 2012, issued to KR 10-2010-0066993 (5 pages).
KIPO Notice of Allowance dated Jul. 20, 2012, issued to KR 10-2010-0003545 (5 pages).
KIPO Notice of Allowance dated Oct. 27, 2011 for Korean Application No. 10-2010-0002381 (5 pages).
KIPO Notice of Allowance dated Oct. 31, 2011, for Korean Patent application 10-2010-0014273, ( 5 pages).
KIPO Notice of Allowance dated Sep. 1, 2012, for Korean Patent application 10-2010-0013847 (5 pages).
KIPO Notice of Allowance dated Sep. 1, 2012, issued to KR 10-2010-0009160 (5 pages).
KIPO Notice of Allowance dated Sep. 1, 2012, issued to KR 10-2010-0013848 (5 pages).
KIPO Notice of Allowance dated Sep. 23, 2011 for Korean Application No. 10-2009-0055473 (5 pages).
KIPO Notice of Allowance dated Sep. 28, 2011 for Korean Application No. 10-2009-0045201 (5 pages).
KIPO Notice of Allowance dated Sep. 28, 2011 for Korean Application No. 10-2009-0052359 (5 pages).
KIPO Notice of Allowance, dated Sep. 1, 2012, issued to KR 10-2010-0014276 (5 pages).
KIPO Office action dated Apr. 2, 2012, issued to KR 10-2010-0066993 (4 pages).
KIPO Office action dated Apr. 4, 2012, issued in KR Application No. 10-2009-0112796 (5 pages).
KIPO Office Action dated Apr. 9, 2012 for Korean Application No. 10-2010-0031556 (4 pages).
KIPO Office action dated Aug. 1, 2011, issued to KR 10-2009-0074001 (3 pages).
KIPO Office Action dated Aug. 28, 2012, issued to KR 10-2010-0014274 (5 pages).
KIPO Office action dated Feb. 1, 2012, for Korean Patent application 10-2010-0013847 (5 pages).
KIPO Office action dated Feb. 1, 2012, issued to KR 10-2010-0014272 (4 pages).
KIPO Office Action dated Feb. 6, 2012 for Korean Application No. 10-2010-0011480 (8 pages).
KIPO Office Action dated Feb. 6, 2012 for Korean Application No. 10-2010-0011481 (7 pages).
KIPO Office Action dated Feb. 6, 2012, issued to KR 10-2010-0014274 (9 pages).
KIPO Office Action dated Feb. 6, 2012, issued to KR 10-2010-0021835 (4 pages).
KIPO Office action dated Jan. 6, 2012, issued to KR Application No. 10-2010-0000897 (4 pages).
KIPO Office action dated Jul. 1, 2011, issued to KR Application No. 10-2009-0072111 (4 pages).
KIPO Office action dated Jun. 1, 2011, issued to KR Application No. 10-2009-0050528 (4 pages).
KIPO Office action dated Mar. 21, 2012, issued to KR Application No. 10-2010-0065465 (5 pages).
KIPO Office action dated Sep. 1, 2012, issued to KR 10-2010-0010136 (5 pages).
KIPO Registration Determination Certificate dated Jul. 2, 2012, for Korean Application No. 10-2010-0011480 (5 pages).
KIPO Registration Determination Certificate dated Jul. 2, 2012, for Korean Application No. 10-2010-0011481 (5 pages).
KIPO Registration Determination Certificate dated Nov. 30, 2011, for Korean application 10-2009-0056530 (5 pages).
KIPO Registration Determination Certificate, dated Jul. 20, 2012, issued to KR Application No. 10-2010-0000897 (5 pages).
Korean Registration Certificate dated Sep. 28, 2011 for Korean Application No. 10-2009-0045200 (5 pages).
SIPO Certificate of Patent dated Aug. 14, 2013, for Chinese application 201100266406.6, (36 pages).
SIPO Certificate of Patent dated Jul. 31, 2013, corresponding to Chinese Patent application 201110029291.3, (31 pages).
SIPO Office action dated Dec. 17, 2013, for Chinese Patent application 201010216896.9 (6 pages).
SIPO Office action dated Feb. 14, 2014, for corresponding Chinese Patent application 201010189614.0 (16 pages).
SIPO Office action dated Mar. 11, 2014, for corresponding Chinese Patent application 201010189581.X (9 pages).
SIPO Office Action dated May 29, 2013, for Chinese Application No. 201010189614.0 (12 pages).
SIPO Office Action dated Nov. 28, 2012 for Chinese Application No. 201110029291.3 (11 pages).
SIPO Office Action dated Oct. 9, 2012 for Chinese Application No. 201010266406.6 (6 pages).
Taiwanese Office action dated Apr. 14, 2014, for Taiwanese Patent application 100114360 (20 pages).
Taiwanese Office action dated Dec. 20, 2013, for Taiwanese Patent application 099116077 (8 pages).
U.S. Interview Summary dated Mar. 11, 2014 for U.S. Appl. No. 12/813,786 (4 pages).
U.S. Notice of Allowance dated Feb. 20, 2014, issued to U.S. Appl. No. 12/907,396 (13 pages).
U.S. Notice of Allowance dated Feb. 28, 2014, issued to U.S. Appl. No. 13/279,077 (12 pages).
U.S. Notice of Allowance dated May 9, 2014 for U.S. Appl. No. 13/194,759 (27 pages).
U.S. Office action dated Apr. 1, 2013, issued to U.S. Appl. No. 12/784,774 (44 pages).
U.S. Office action dated Apr. 18, 2014, issued to U.S. Appl. No. 12/814,816 (9 pages).
U.S. Office action dated Apr. 29, 2013, issued to U.S. Appl. No. 12/820,355 (31 pages).

(56) References Cited

OTHER PUBLICATIONS

U.S. Office action dated Aug. 13, 2013, issued to U.S. Appl. No. 13/194,759, (28 pages).
U.S. Office Action dated Aug. 2, 2013 for U.S. Appl. No. 12/868,099 (32 pages).
U.S. Office action dated Aug. 21, 2013 issued in cross-reference U.S. Appl. No. 12/820,355 (14 pages).
U.S. Office action dated Aug. 7, 2013, issued to U.S. Appl. No. 13/015,357, (30 pages).
U.S. Office action dated Aug. 8, 2013, for cross reference U.S. Appl. No. 13/093,707, (7 pages).
U.S. Office Action dated Dec. 13, 2011 for U.S. Appl. No. 12/849,193 (30 pages).
U.S. Office action dated Dec. 16, 2013 for U.S. Appl. No. 14/054,536 (35 pages).
U.S. Office action dated Dec. 17, 2012, issued to U.S. Appl. No. 12/873,556 (37 pages).
U.S. Office action dated Dec. 26, 2012, issued to U.S. Appl. No. 12/815,673 (21 pages).
U.S. Office action dated Feb. 11, 2014, for cross reference U.S. Appl. No. 13/178,472 (8 pages).
U.S. Office action dated Feb. 26, 2013, issued to U.S. Appl. No. 12/794,093 (31 pages).
U.S. Office action dated Feb. 6, 2014, for U.S. Appl. No. 12/984,231 (16 pages).
U.S. Office action dated Jan. 25, 2013, issued to U.S. Appl. No. 13/015,357 (21 pages).
U.S. Office action dated Jul. 11, 2013 for U.S. Appl. No. 13/461,669 (27 pages).
U.S. Office action dated Jul. 17, 2013, issued to U.S. Appl. No. 12/984,231, (18 pages).
U.S. Office action dated Jul. 24, 2013, issued to U.S. Appl. No. 12/784,804, (52 pages).
U.S. Office action dated Jul. 3, 2013 in U.S. Appl. No. 12/873,689 (48 pages).
U.S. Office action dated Jul. 5, 2013, issued to U.S. Appl. No. 12/873,556, (17 pages).
U.S. Office Action dated Jun. 11, 2013 for U.S. Appl. No. 12/979,656 (50 pages).
U.S. Office action dated Jun. 11, 2013, issued to U.S. Appl. No. 12/862,125 (37 pages).
U.S. Office action dated Jun. 17, 2013, for cross reference U.S. Appl. No. 13/180,454, (23 pages).
U.S. Office Action dated Jun. 21, 2011 for U.S. Appl. No. 12/862,153 (21 pages).
U.S. Office action dated Jun. 26, 2013, issued to U.S. Appl. No. 12/794,093 (20 pages).
U.S. Office action dated Mar. 15, 2013, issued to U.S. Appl. No. 12/813,786 (33 pages).
U.S. Office action dated Mar. 17, 2014, for U.S. Appl. No. 12/950,361 (48 pages).
U.S. Office action dated Mar. 18, 2013, issued to U.S. Appl. No. 12/984,231 (29 pages).
U.S. Office action dated Mar. 19, 2013, issued to U.S. Appl. No. 13/194,759 (36 pages).
U.S. Office action dated Mar. 22, 2013, issued to U.S. Appl. No. 12/987,569 (12 pages).
U.S. Office Action dated Mar. 23, 2012 for U.S. Appl. No. 12/849,193 (17 pages).
U.S. Office action dated May 22, 2013, for cross reference U.S. Appl. No. 13/219,427, (26 pages).
U.S. Office action dated May 24, 2013, for U.S. Appl. No. 13/279,077 (20 pages).
U.S. Office action dated May 24, 2013, issued to U.S. Appl. No. 12/849,092 (31 pages).
U.S. Office Action dated May 7, 2013, issued in U.S. Appl. No. 12/820,270 (37 pages).
U.S. Office action dated Nov. 20, 2013, for cross reference U.S. Appl. No. 12/868,099, (14 pages).
U.S. Office action dated Nov. 22, 2013, issued to U.S. Appl. No. 13/198,591, (28 pages).
U.S. Office action dated Nov. 25, 2013, issued to U.S. Appl. No. 13/176,701, (49 pages).
U.S. Office action dated Nov. 4, 2013, for U.S. Appl. No. 13/219,427, (26 pages).
U.S. Office action dated Oct. 1, 2013, issued to U.S. Appl. No. 12/849,092, (13 pages).
U.S. Office action dated Oct. 11, 2013, issued to U.S. Appl. No. 12/907,396, (44 pages).
U.S. Office action dated Oct. 21, 2013, issued to U.S. Appl. No. 12/987,569, (14 pages).
U.S. Office Action dated Oct. 3, 2013 for U.S. Appl. No. 12/869,830 (28 pages).
U.S. Office action dated Oct. 7, 2013, issued to U.S. Appl. No. 13/279,077, (29 pages).
U.S. Office action dated Sep. 20, 2013, issued to U.S. Appl. No. 13/014,225, (33 pages).
U.S. Office action dated Sep. 25, 2013, for U.S. Appl. No. 13/031,756, (34 pages).
U.S. Office action dated Sep. 27, 2013, issued to U.S. Appl. No. 12/814,816 (19 pages).
U.S. Patent Office Action dated May 16, 2013, issued to U.S. Appl. No. 13/235,337 (28 pages).
US Notice of Allowance, dated Mar. 18, 2013, issued to U.S. Appl. No. 12/795,001 (29 pages).
US Office action dated Dec. 20, 2012, issued to U.S. Appl. No. 12/984,289 (20pages).
US Office action dated Sep. 12, 2012, in U.S. Appl. No. 12/515,673 (26 pages).

\* cited by examiner

ORGANIC LAYER DEPOSITION APPARATUS AND METHOD OF MANUFACTURING ORGANIC LIGHT-EMITTING DISPLAY DEVICE BY USING THE SAME

CROSS-REFERENCE TO RELATED APPLICATION

This application claims priority to and the benefit of Korean Patent Application No. 10-2011-0049792, filed on May 25, 2011 in the Korean Intellectual Property Office, the entire content of which is incorporated herein by reference.

BACKGROUND

1. Field

Aspects of embodiments of the present invention relate to an organic layer deposition apparatus and a method of manufacturing an organic light-emitting display device by using the same.

2. Description of the Related Art

Organic light-emitting display devices typically have a larger viewing angle, better contrast characteristics, and a faster response rate than other display devices, and thus have drawn attention as a next-generation display device.

Organic light-emitting display devices generally have a stacked structure including an anode, a cathode, and an emission layer interposed between the anode and the cathode. The devices display images in color when holes and electrons, injected respectively from the anode and the cathode, recombine in the emission layer and emit light. However, it is difficult to achieve high light-emission efficiency with such a structure, and thus intermediate layers, including an electron injection layer, an electron transport layer, a hole transport layer, a hole injection layer, or the like, may be additionally interposed between the emission layer and each of the electrodes.

However, it is very difficult to pattern fine patterns of organic thin films such as the emission layer and the intermediate layers, and light-emission efficiencies of red, green, and blue lights vary depending on the layers. Thus, it is difficult to perform the patterning operation on a large-sized substrate by using the conventional organic layer deposition apparatus. Therefore, a large-sized organic light-emitting display device having satisfactory driving voltage, current density, brightness, color purity, light-emission efficiency, and lifespan may not be manufactured.

The above information disclosed in this Background section is only for enhancement of understanding of the background of the described technology and, therefore, it may contain information that does not form the prior art that is already known in this country to a person of ordinary skill in the art.

SUMMARY

According to aspects of embodiments of the present invention, an organic layer deposition apparatus may be easily manufactured, may be simply applied to manufacture large-sized display devices on a mass scale, and improves manufacturing yield and deposition efficiency. According to another aspect of embodiments of the present invention, a method of manufacturing an organic light-emitting display device uses the organic layer deposition apparatus.

According to an embodiment of the present invention, an organic layer deposition apparatus for forming an organic layer on a substrate includes: a deposition source configured to discharge a deposition material; a deposition source nozzle unit arranged at a side of the deposition source and including a plurality of deposition source nozzles; and a patterning slit sheet facing the deposition source nozzle unit and including a plurality of patterning slits and at least one spacer arranged between a pair of adjacent patterning slits of the plurality of patterning slits, the patterning slit sheet being smaller than the substrate in at least one of a first direction or a second direction perpendicular to the first direction, and the substrate is spaced apart from the organic layer deposition apparatus by a predetermined distance, and at least one of the substrate or the organic layer deposition apparatus is movable relative to the other.

The at least one spacer may protrude to a predetermined height from the patterning slit sheet toward the substrate.

A thickness of each of the at least one spacer may be less than or equal to the distance between the substrate and the organic layer deposition apparatus.

The at least one spacer may include two spacers arranged between the pair of adjacent patterning slits, and each of the two spacers may be located at a side of each of the pair of adjacent patterning slits.

The at least one spacer and the patterning slit sheet may be integrally formed with each other.

The patterning slit sheet may include a patterning sheet including the plurality of patterning slits, and a spacer sheet including the at least one spacer.

The at least one spacer may be disposed to correspond to a pixel defining layer formed on the substrate.

The patterning slit sheet of the organic layer deposition apparatus may be smaller than the substrate.

Deposition source nozzles of the plurality of deposition nozzles may be arranged in the first direction, and patterning slits of the plurality of patterning slits may be arranged in the second direction.

The deposition source, the deposition source nozzle unit, and the patterning slit sheet may be integrally formed together with a connection member.

The connection member may form a flow path of the deposition material.

The connection member may seal a space between the deposition source nozzle unit and the patterning slit sheet.

Deposition source nozzles of the plurality of deposition source nozzles may be tilted at a predetermined angle.

The plurality of deposition source nozzles may include deposition source nozzles arranged in two rows extending in the first direction, and the deposition source nozzles in the two rows may be tilted toward each other.

The plurality of deposition source nozzles may include deposition source nozzles arranged in two rows extending in the first direction, the deposition source nozzles of a row located at a first side of the patterning slit sheet may be arranged to face a second side of the patterning slit sheet, and the deposition source nozzles of the other row located at the second side of the patterning slit sheet may be arranged to face the first side of the patterning slit sheet.

Deposition source nozzles of the plurality of deposition source nozzles may be arranged in the first direction, patterning slits of the plurality of patterning slits may be arranged in the first direction, and the organic layer deposition apparatus may further include a barrier plate assembly including a plurality of barrier plates arranged between the deposition source nozzle unit and the patterning slit sheet in the first direction and partitioning a space between the deposition source nozzle unit and the patterning slit sheet into a plurality of sub-deposition spaces.

Barrier plates of the plurality of barrier plates may extend in the second direction.

The barrier plate assembly may include a first barrier plate assembly including a plurality of first barrier plates, and a second barrier plate assembly including a plurality of second barrier plates.

Each of the first barrier plates and each of the second barrier plates may extend in the second direction and partition the space between the deposition source nozzle unit and the patterning slit sheet into the plurality of sub-deposition spaces.

The apparatus may further include a chamber, wherein deposition source nozzles of the plurality of deposition source nozzles are arranged in the first direction, the patterning slit sheet is fixedly coupled to an inner side of the chamber, and patterning slits of the plurality of patterning slits are arranged in the second direction.

The apparatus may further include a first conveyor unit configured to move an electrostatic chuck on which the substrate is fixed along the first direction.

The first conveyor unit may include: a frame receiving the deposition source; and a sheet supporting member protruding from an inner side surface of the frame and supporting the patterning slit sheet.

The apparatus may further include: a loading unit configured to fix the substrate on the electrostatic chuck; and an unloading unit configured to separate the substrate on which deposition is performed from the electrostatic chuck.

According to another embodiment of the present invention, a method of manufacturing an organic light-emitting display device using an organic layer deposition apparatus including a deposition source, a deposition source nozzle unit arranged at a side of the deposition source and including a plurality of deposition source nozzles, and a patterning slit sheet facing the deposition source nozzle unit and including a plurality of patterning slits and at least one spacer arranged between a pair of adjacent patterning slits of the plurality of patterning slits includes: spacing a substrate that is a deposition target apart from the organic layer deposition apparatus by a predetermined distance, the patterning slit sheet being smaller than the substrate in at least one of a first direction or a second direction perpendicular to the first direction; discharging a deposition material from the organic layer deposition apparatus; and depositing the deposition material onto the substrate while moving at least one of the organic layer deposition apparatus or the substrate relative to the other.

The at least one spacer may protrude to a predetermined height from the patterning slit sheet toward the substrate.

A thickness of each of the at least one spacer may be less than or equal to the distance between the substrate and the organic layer deposition apparatus.

The at least one spacer may include two spacers arranged between the pair of adjacent patterning slits, and each of the two spacers may be located at a side of each of the pair of adjacent patterning slits.

The at least one spacer and the patterning slit sheet may be integrally formed with each other.

The patterning slit sheet may include a patterning sheet including the plurality of patterning slits, and a spacer sheet including the at least one spacer.

The at least one spacer may be disposed to correspond to a pixel defining layer formed on the substrate.

The patterning slit sheet of the organic layer deposition apparatus may be smaller than the substrate.

Deposition source nozzles of the plurality of deposition nozzles may be arranged in the first direction, and patterning slits of the plurality of patterning slits may be arranged in the second direction.

Deposition source nozzles of the plurality of deposition source nozzles may be arranged in the first direction, patterning slits of the plurality of patterning slits may be arranged in the first direction, and the organic layer deposition apparatus may further include a barrier plate assembly including a plurality of barrier plates arranged between the deposition source nozzle unit and the patterning slit sheet in the first direction and partitioning a space between the deposition source nozzle unit and the patterning slit sheet into a plurality of sub-deposition spaces.

The apparatus may further include a chamber, wherein deposition source nozzles of the plurality of deposition source nozzles are arranged in the first direction, the patterning slit sheet is fixedly coupled to an inner side of the chamber, and patterning slits of the plurality of patterning slits are arranged in the second direction.

According to another embodiment of the present invention, an organic light-emitting display device is manufactured using the above-described organic layer deposition apparatus.

BRIEF DESCRIPTION OF THE DRAWINGS

The above and other features and advantages of the present invention will become more apparent by describing in further detail some exemplary embodiments thereof with reference to the attached drawings in which.

DETAILED DESCRIPTION

Some exemplary embodiments of the present invention will be described more fully hereinafter with reference to the accompanying drawings; however, embodiments of the present invention may be embodied in different forms and should not be construed as limited to the exemplary embodiments illustrated and set forth herein. Rather, these exemplary embodiments are provided by way of example for understanding of the invention and to convey the scope of the invention to those skilled in the art. As those skilled in the art would realize, the described embodiments may be modified in various ways, all without departing from the spirit or scope of the present invention.

Figure 1:
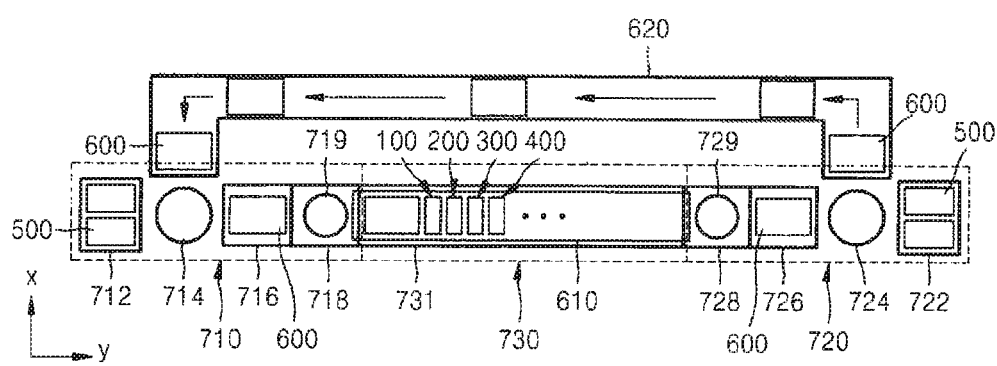
FIG. 1 is a schematic block diagram of an organic layer deposition apparatus according to an embodiment of the present invention.

FIG. 1 is a schematic block diagram of an organic layer deposition apparatus according to an embodiment of the present invention;

Referring to FIG. 1, the organic layer deposition apparatus according to an embodiment of the present invention includes a loading unit 710, a deposition unit 730, an unloading unit 720, a first conveyer unit 610, and a second conveyer unit 620.

The loading unit 710, in one embodiment, includes a first rack 712, a transport robot 714, a transport chamber 716, and a first inversion chamber 718.

A plurality of substrates 500 on which a deposition material has not been applied are stacked on the first rack 712. The transport robot 714 picks up a substrate 500 from the first rack 712, disposes it on an electrostatic chuck 600 transferred by the second conveyer unit 620, and moves the electrostatic chuck 600 on which the substrate 500 is disposed into the transport chamber 716.

The first inversion chamber 718 is disposed adjacent to the transport chamber 716. The first inversion chamber 718 includes a first inversion robot 719 that inverts the electrostatic chuck 600 and then loads it into the first conveyer unit 610 of the deposition unit 730.

Figure 2:
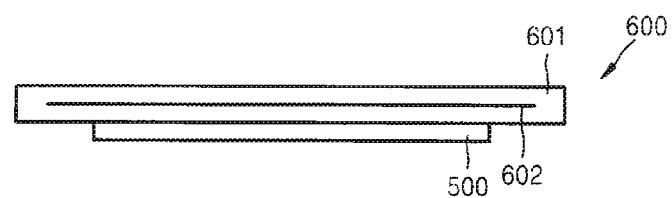
FIG. 2 is a schematic side view of an electrostatic chuck of the organic layer deposition apparatus of FIG. 1, according to an embodiment of the present invention.

Referring to FIG. 2, the electrostatic chuck 600 may include an electrode 602 embedded in a main body 601 formed of ceramic, wherein the electrode 602 is supplied with power. The substrate 500 is attached onto a surface of the main body 601 of the electrostatic chuck 600 as a voltage (e.g., a high voltage) is applied to the electrode 602.

Referring to FIG. 1, the transport robot 714 places one of the substrates 500 on an upper surface of the electrostatic chuck 600, and the electrostatic chuck 600 on which the substrate 500 is disposed is loaded into the transport chamber 716. The first inversion robot 719 inverts the electrostatic chuck 600 such that the substrate 500 is turned upside down in the deposition unit 730.

The unloading unit 720 is configured to operate in an opposite manner to the loading unit 710 described above. In one embodiment, a second inversion robot 729 in a second inversion chamber 728 inverts the electrostatic chuck 600, which has passed through the deposition unit 730 while the substrate 500 is disposed on the electrostatic chuck 600, and then moves the electrostatic chuck 600 on which the substrate 500 is disposed into an ejection chamber 726. Then, an ejection robot 724 removes the electrostatic chuck 600 on which the substrate 500 is disposed from the ejection chamber 726, separates the substrate 500 from the electrostatic chuck 600, and then loads the substrate 500 into a second rack 722. The electrostatic chuck 600 separated from the substrate 500 is returned to the loading unit 710 via the second conveyer unit 620.

However, the present invention is not limited to the above description. For example, in one embodiment, when disposing the substrate 500 on the electrostatic chuck 600, the substrate 500 may be fixed onto a bottom surface of the electrostatic chuck 600 and then moved into the deposition unit 730. In such an embodiment, for example, the first inversion chamber 718, the first inversion robot 719, the second inversion chamber 728, and the second inversion robot 729 may be omitted.

The deposition unit 730 may include at least one deposition chamber. As illustrated in FIG. 1, the deposition unit 730 may include a chamber 731, in which first to fourth organic layer deposition assemblies 100, 200, 300, and 400 may be disposed. Although FIG. 1 depicts four organic layer deposition assemblies, i.e. the first to fourth organic layer deposition assemblies 100, 200, 300, and 400 in the first chamber 731, a number of organic layer deposition assemblies that may be installed in the first chamber 731 may be varied in other embodiments, such as according to a deposition material and deposition conditions. The first chamber 731, in one embodiment, is maintained in a vacuum state during a deposition process.

In the embodiment illustrated in FIG. 1, the electrostatic chuck 600 on which the substrate 500 is disposed may be moved at least to the deposition unit 730 or may be moved sequentially to the loading unit 710, the deposition unit 730, and the unloading unit 720, by the first conveyor unit 610. The electrostatic chuck 600 that is separated from the substrate 500 in the unloading unit 720 is moved back to the loading unit 710 by the second conveyor unit 620.

Figure 3:
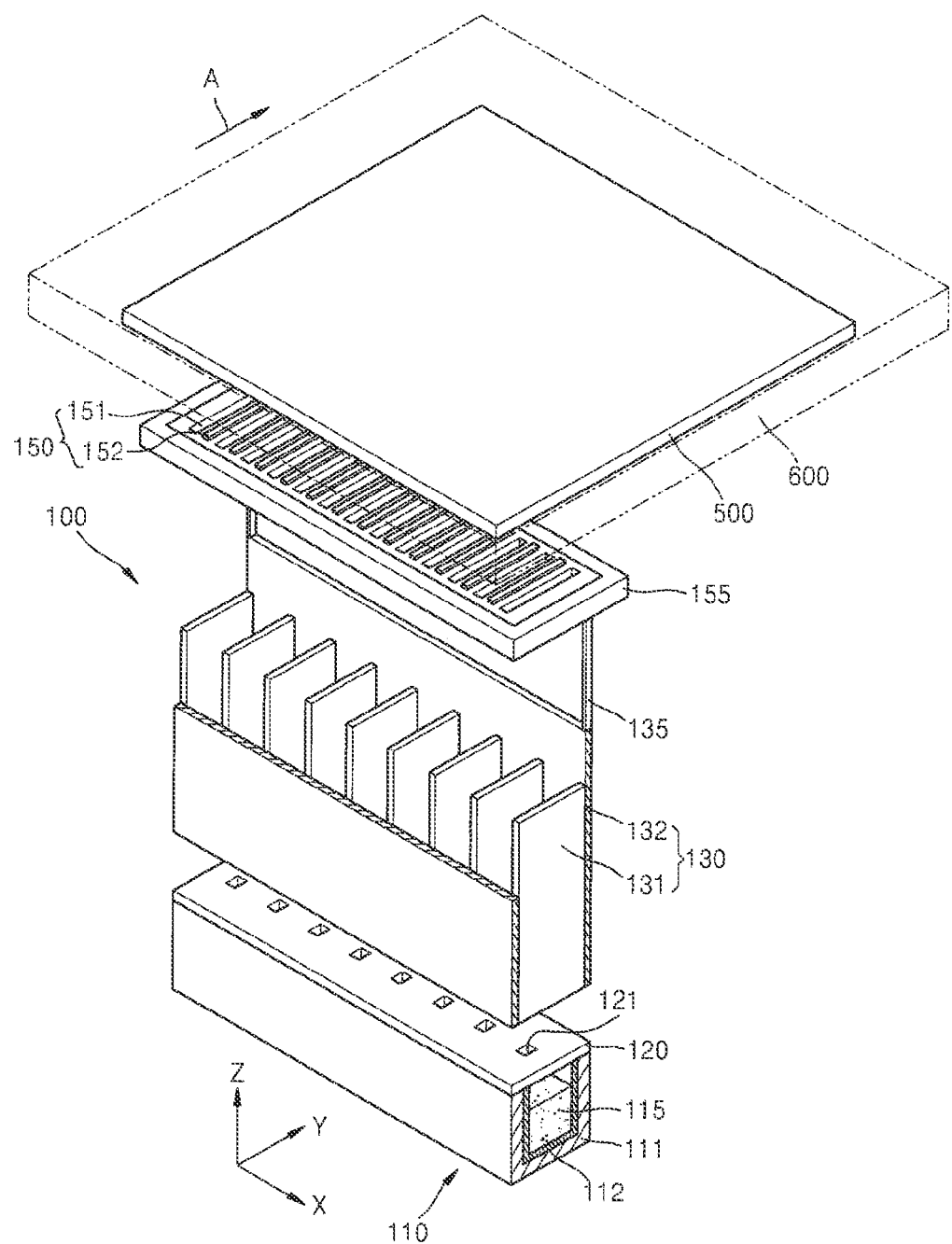
FIG. 3 is a schematic perspective view of an organic layer deposition assembly of the organic layer deposition apparatus of FIG. 1, according to an embodiment of the present invention.
Figure 4:
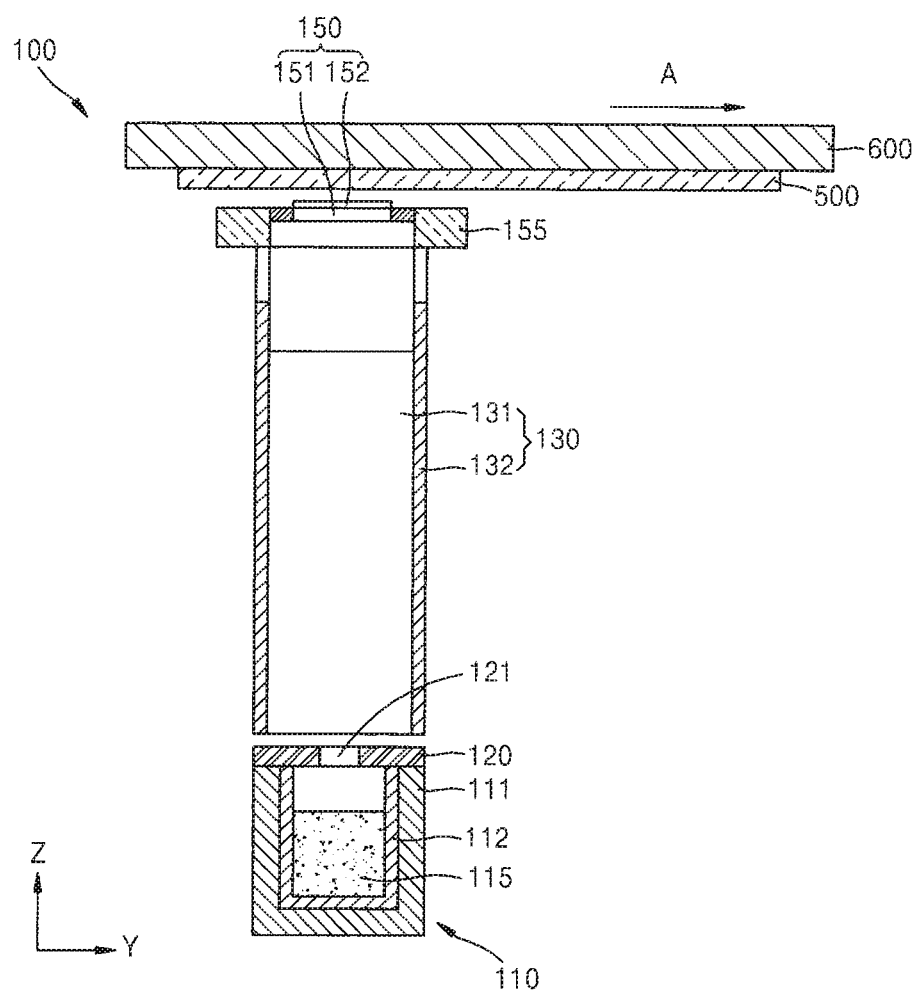
FIG. 4 is a schematic side cross-sectional view of the organic layer deposition assembly of FIG. 3.

The organic layer deposition assembly 100 of the organic layer deposition apparatus, according to an embodiment of the present invention, will now be described. FIG. 3 is a schematic perspective view of the organic layer deposition assembly 100 of the organic layer deposition apparatus of FIG. 1, according to an embodiment of the present invention; FIG. 4 is a schematic side cross-sectional view of the organic layer deposition assembly 100; and FIG. 5 is a schematic front cross-sectional view of the organic layer deposition assembly 100.

Figure 5:
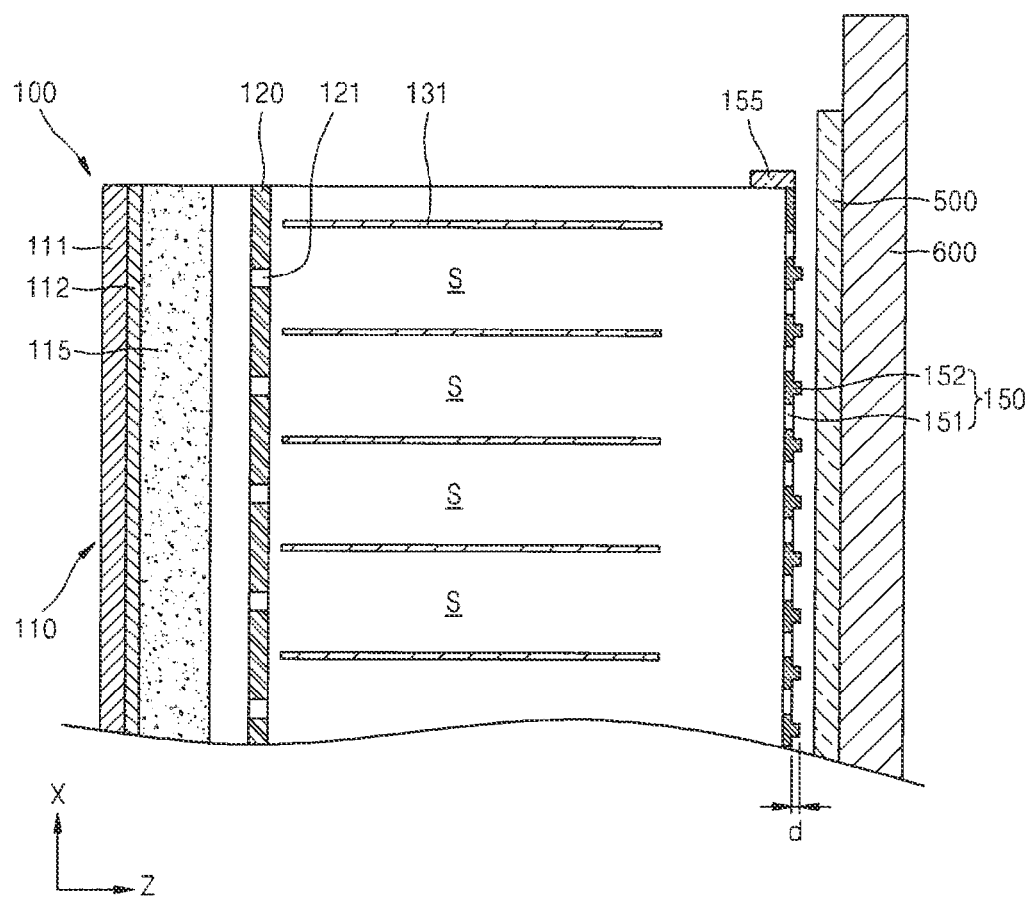
FIG. 5 is a schematic front cross-sectional view of the organic layer deposition assembly of FIG. 3.

Referring to FIGS. 3 through 5, the organic layer deposition assembly 100 according to an embodiment of the present invention includes a deposition source 110, a deposition source nozzle unit 120, a barrier plate assembly 130, and a patterning slit sheet 150.

Although a chamber is not illustrated in FIGS. 3 through 5 for purposes of illustration, the components of the organic layer deposition assembly 100 may be disposed within a chamber that is maintained at an appropriate degree of vacuum in order to allow a deposition material to move in a substantially straight line through the organic layer deposition assembly 100.

In the chamber 731 (see FIG. 1), the substrate 500, which constitutes a deposition target, is transferred by the electrostatic chuck 600. The substrate 500 may be a substrate for flat panel displays. A large substrate, such as a mother glass, for manufacturing a plurality of flat panel displays, may be used as the substrate 500. Other substrates may also be used.

In an embodiment of the present invention, the substrate 500 or the organic layer deposition assembly 100 may be moved relative to the other. For example, the substrate 500 may be moved in a direction of an arrow "A" relative to the organic layer deposition assembly 100.

In a conventional deposition method using a fine metal mask (FMM), the size of the FMM has to be greater than or equal to the size of a substrate. Thus, the size of the FMM has to be increased as the substrate becomes larger. However, it is neither straightforward to manufacture a large FMM nor to extend an FMM to be accurately aligned with a pattern.

The above-described problem is overcome in the organic layer deposition assembly 100 according to the present invention, as deposition may be performed while the organic layer deposition assembly 100 or the substrate 500 is moved relative to the other. In other words, in one embodiment, deposition may be continuously performed while the substrate 500, which is disposed such as to face the organic layer deposition assembly 100, is moved in a Y-axis direction (i.e. in the direction of the arrow "A"). That is, deposition may be performed in a scanning manner while the substrate 500 is moved in the direction of the arrow "A" in FIG. 3. Although the substrate 500 is illustrated as being moved in the Y-axis direction of the chamber (refer to 731 of FIG. 1) when deposition is performed, the present invention is not limited thereto. For example, in another embodiment, deposition may be performed while the organic layer deposition assembly 100 is moved in the Y-axis direction, whereas the substrate 500 is fixed.

In the organic layer deposition assembly 100 according to an embodiment of the present invention, the patterning slit sheet 150 may be significantly smaller than a FMM used in a conventional deposition method. In the organic layer deposition assembly 100, deposition may be continuously performed, such as in a scanning manner, while the substrate 500 is moved in the Y-axis direction. Thus, a length of the patterning slit sheet 150 in the Y-axis direction may be less (e.g., significantly less) than a length of the substrate 500, and a width of the patterning slit sheet 150 in an X-axis direction perpendicular to the Y-axis direction and a width of the substrate 500 in the X-axis direction may be substantially equal to each other. However, in another embodiment, the width of the patterning slit sheet 150 in the X-axis direction may be less than the width of the substrate 500 in the X-axis direction, and deposition may be performed on the entire substrate 500 in a scanning manner while the substrate 500 or the organic layer deposition assembly 100 is moved relative to each other.

As described above, since the patterning slit sheet 150 may be formed to be significantly smaller than a FMM used in a conventional deposition method, it is relatively easy to manufacture the patterning slit sheet 150 of the present invention. As such, using the patterning slit sheet 150, which is smaller than a FMM used in a conventional deposition method, is more convenient in many or all processes, including etching and other subsequent processes, such as precise extension, welding, moving, and cleaning processes, compared to the conventional deposition method using the larger FMM. Therefore, embodiments of the present invention are advantageous for manufacturing of a relatively large display device.

In order to perform deposition while the organic layer deposition assembly 100 or the substrate 500 is moved relative to the other as described above, the organic layer deposition assembly 100 and the substrate 500 may be separated from each other by a predetermined distance. This is described in further detail later herein.

The deposition source 110 that contains and heats a deposition material 115 is disposed at a side of the chamber opposite to a side in which the substrate 500 is disposed.

The deposition source 110, in one embodiment, includes a crucible 112 that is filled with the deposition material 115, and a cooling block 111 surrounding the crucible 112. The cooling block 111 prevents or substantially prevents radiation of heat from the crucible 112 to the outside (i.e. into the chamber). The cooling block 111 may include a heater (not shown) that heats the crucible 112.

The deposition source nozzle unit 120 is disposed at a side of the deposition source 110 facing the substrate 500. The deposition source nozzle unit 120, in one embodiment, includes a plurality of deposition source nozzles 121 arranged (e.g., arranged at equal intervals) in the X-axis direction. The deposition material 115 that is vaporized in the deposition source 110 passes through the deposition source nozzles 121 of the deposition source nozzle unit 120 toward the substrate 500, which constitutes the deposition target on which the deposition material 115 is to be deposited.

The barrier plate assembly 130 is disposed at a side of the deposition source nozzle unit 120. The barrier plate assembly 130 includes a plurality of barrier plates 131, and a barrier plate frame 132 that covers sides of the barrier plates 131. The plurality of barrier plates 131, in one embodiment, may be arranged parallel to each other (e.g., arranged at equal intervals) in the X-axis direction. In one embodiment, each of the barrier plates 131 may be arranged parallel to the Y-Z plane in FIG. 3. In one embodiment, each of the barrier plates may have a generally rectangular shape. The plurality of barrier plates 131 partition the space between the deposition source nozzle unit 120 and the patterning slit sheet 150 into a plurality of sub-deposition spaces S. In the organic layer deposition assembly 100 according to an embodiment of the present invention, as illustrated in FIG. 5, the deposition space is divided by the barrier plates 131 into the sub-deposition spaces S that respectively correspond to the deposition source nozzles 121 through which the deposition material 115 is discharged.

The barrier plates 131 may be respectively disposed between adjacent deposition source nozzles 121. In one embodiment, each of the deposition source nozzles 121 may be disposed between two adjacent barrier plates 131. In one embodiment, the deposition source nozzles 121 may be respectively located at the midpoint between two adjacent barrier plates 131. However, the present invention is not limited to this structure. For example, in another embodiment, a plurality of deposition source nozzles 121 may be disposed between two adjacent barrier plates 131. In this case, the deposition source nozzles 121 may be respectively located at or about the midpoint between two adjacent barrier plates 131.

In one embodiment, since the barrier plates 131 partition the space between the deposition source nozzle unit 120 and the patterning slit sheet 150 into the plurality of sub-deposition spaces S, the deposition material 115 discharged through each of the deposition source nozzles 121 is not mixed with the deposition material 115 discharged through the other deposition source nozzles 121, and passes through patterning slits 151 of the patterning slit sheet 150 so as to be deposited on the substrate 500. That is, in one embodiment, the barrier plates 131 guide the deposition material 115 which is discharged through the deposition source nozzles 121 to move straight, and not flow in the X-axis direction.

As described above, in one embodiment, the deposition material 115 is restricted to move straight by installing the barrier plates 131, such that a smaller shadow zone may be formed on the substrate 500 compared to an assembly in which no barrier plates are installed. Thus, in one embodiment, the organic layer deposition assembly 100 and the substrate 500 may be separated from each other by a predetermined distance, as is described in further detail later herein.

The patterning slit sheet 150 and a frame 155 in which the patterning slit sheet 155 is bound are disposed between the deposition source 110 and the substrate 500. The frame 155 may be formed in a lattice shape, similar to a window frame. The patterning slit sheet 150 includes a plurality of patterning slits 151 arranged, or spaced from one another, in the X-axis direction. The patterning slits 151 extend along the Y-axis direction. The deposition material 115 that has been vaporized in the deposition source 110 and passed through the deposition source nozzle 121 passes through the patterning slits 151 toward the substrate 500 which constitutes the deposition target.

The patterning slit sheet 150 may be formed of a metal thin film. The patterning slit sheet 150, in one embodiment, is fixed to the frame 155 such that a tensile force is exerted thereon. The patterning slits 151, in one embodiment, may be formed by etching the patterning slit sheet 150 in a stripe pattern. The number of patterning slits 151, in one embodiment, may be equal to the number of deposition patterns to be formed on the substrate 500.

In the organic layer deposition assembly 100 according to an embodiment of the present invention, one or more spacers 152 are formed between two adjacent patterning slits 151. This will be described in further detail later herein.

In one embodiment, the barrier plate assembly 130 and the patterning slit sheet 150 may be disposed to be separated from each other by a predetermined distance. Alternatively, the barrier plate assembly 130 and the patterning slit sheet 150 may be connected by a connection member 135.

As described above, the organic layer deposition assembly 100 according to an embodiment of the present invention performs deposition while being moved relative to the substrate 500. In order to move the organic layer deposition assembly 100 relative to the substrate 500, the patterning slit sheet 150 is separated from the substrate 500 by a predetermined distance. In addition, in order to prevent or substantially prevent the formation of a relatively large shadow zone on the substrate 500 when the patterning slit sheet 150 and the substrate 500 are separated from each other, the barrier plates 131 are arranged between the deposition source nozzle unit 120 and the patterning slit sheet 150 to direct the deposition material 115 to move in a straight direction. Thus, the size of a shadow zone that may otherwise be formed on the substrate 500 is substantially reduced.

In a conventional deposition method using a FMM, deposition is performed with the FMM in close contact with a substrate in order to prevent formation of a shadow zone on the substrate. However, when the FMM is used in close contact with the substrate, the contact may cause defects, such as scratches on patterns formed on the substrate. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In the organic layer deposition assembly 100 according to an embodiment of the present invention, the patterning slit sheet 150 is disposed to be separated from the substrate 500 by a predetermined distance. This may be facilitated by installing the barrier plates 131 to reduce the size of the shadow zone formed on the substrate 500.

Thin films such as organic layers in the organic light-emitting display device may be formed by using the organic layer deposition apparatus, and formation of the thin films will be described further later herein.

In the organic layer deposition assembly 100 according to an embodiment of the present invention, one or more spacers 152 are formed between two adjacent patterning slits 151.

In the organic layer deposition assembly according to an embodiment of the present invention, the patterning slit sheet 150 is formed to be significantly smaller than a FMM used in a conventional deposition method. In addition, deposition is performed while at least one of the organic layer deposition assembly 100 or the substrate 500 is moved relative to the other in order to deposit organic materials on the large-sized substrate by using the patterning slit sheet 150 having a smaller size. In order to perform deposition while the organic layer deposition assembly 100 or the substrate 500 is moved relative to the other as described above, the organic layer deposition assembly 100 and the substrate 500 are separated from each other by a predetermined distance.

Since the deposition is performed while the organic layer deposition assembly 100 and the substrate 500 are separated from each other by a predetermined distance, a shadow may be formed on the substrate 500 to some extent. Although it may not cause a problem when the shadow is formed on a pixel defining layer (refer to 35 of FIG. 13) between neighboring pixels, color mixture and defective light emission may occur if the organic material is deposited on the neighboring pixels over the pixel defining layer. Thus, non-uniformity of pixels increases due to the color mixture, and thereby degrading lifespan of the organic light-emitting display device. A width of the pixel defining layer which defines a pixel region may be increased in order to prevent or substantially prevent the color mixture from occurring; however, the increase of the width of the pixel defining layer may not be desirable because it may lower an aperture rate.

In the organic layer deposition assembly 100 according to an embodiment of the present invention, one or more spacers 152 are formed between the two adjacent patterning slits 151 and may reduce the above-described shadow.

Figure 6:
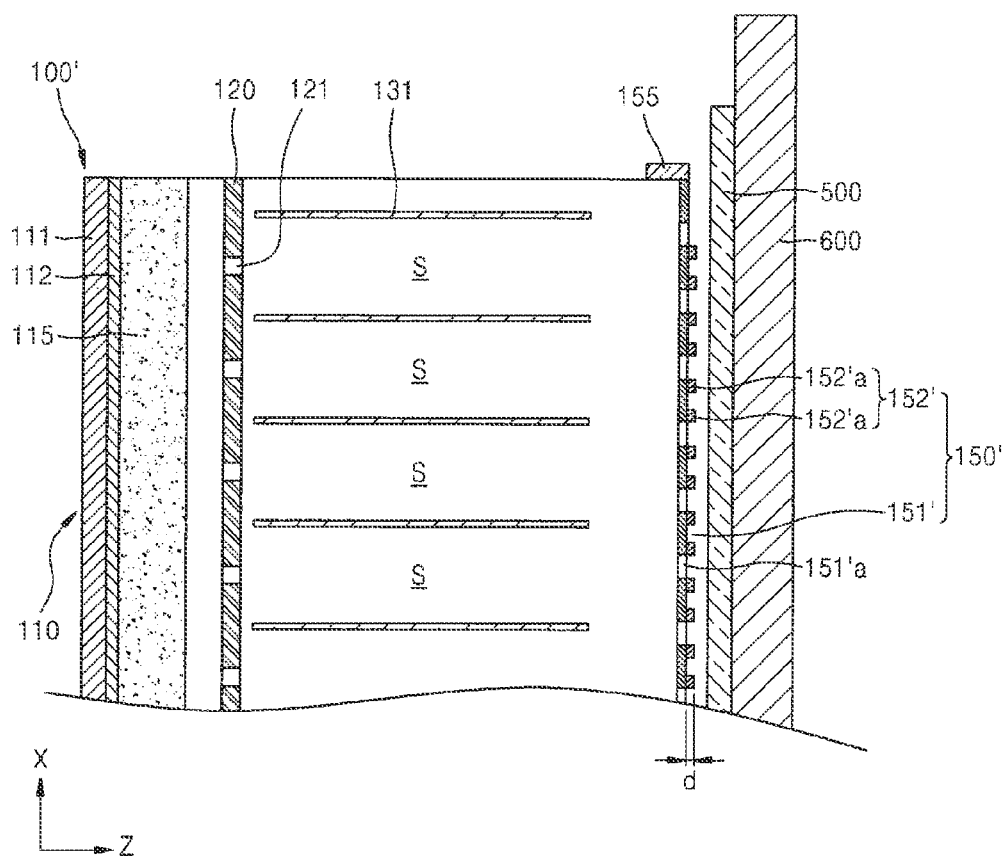
FIG. 6 is a schematic front cross-sectional view of an organic layer deposition assembly according to another embodiment of the present invention.

FIG. 5 is a schematic front cross-sectional view showing the patterning slit sheet 150 according to an embodiment of the present invention, in which patterning slits and spacers are integrally formed with each other in one sheet. FIG. 6 is a schematic front cross-sectional view of an organic layer deposition assembly 100' including a patterning slit sheet 150' according to another embodiment of the present invention, in which a patterning sheet and a spacer sheet are bonded or attached to each other to form the patterning slit sheet 150'.

Referring to FIG. 5, the patterning slit sheet 150, in one embodiment, includes the plurality of patterning slits 151 arranged in the X-axis direction, and one or more spacers 152 between two adjacent patterning slits 151. When the patterning slits 151 and the spacers 152 are integrally formed with each other on one sheet, as shown in FIG. 5, the patterning slit sheet 150 may be formed by etching. In one embodiment, one spacer 152 is formed between the two adjacent patterning slits 151, as illustrated in FIG. 5; however, the present invention is not limited thereto. For example, in other embodiments, the number, size, and shape of the spacers 152 may be varied depending on, for example, the shape and size of the organic layer to be deposited, and fabrication processes of the patterning slit sheet 150.

Referring to FIG. 6, the patterning slit sheet 150' includes a patterning sheet 151' and a spacer sheet 152'. The patterning sheet 151' includes a plurality of patterning slits 151'a arranged in the X-axis direction. The spacer sheet 152' includes a plurality of spacers 152'a arranged in the X-axis direction. Here, when the two sheets, that is, the patterning sheet 151' and the spacer sheet 152' are formed and the two sheets are bonded or attached to each other to form the patterning slit sheet 150', as shown in FIG. 6, the two sheets may be bonded to each other by welding, for example. In one embodiment, two spacers 152'a are formed between the two adjacent patterning slits 151'a, as illustrated in FIG. 6. However, the present invention is not limited thereto. For example, in other embodiments, the number, size, and shape of the spacer 152'a may be varied depending on, for example, the shape and size of the organic layer to be deposited, and fabrication processes of the patterning slit sheet 150'. In one embodiment, two spacers 152'a are formed between the two adjacent patterning slits 151'a, as shown in FIG. 6, and the two spacers 152'a may be formed to be adjacent to the patterning slits 151'a.

Figure 13:
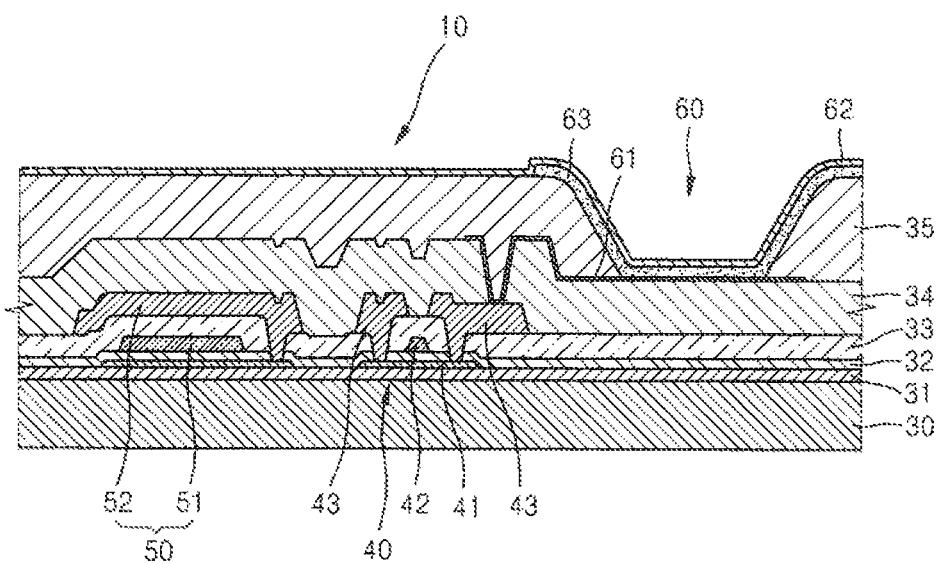
FIG. 13 is a schematic cross-sectional view of an active matrix organic light-emitting display device fabricated by using an organic layer deposition apparatus, according to an embodiment of the present invention.

The spacer 152 or 152'a may be aligned on an area on which non-emission units such as the pixel defining layer (refer to 35 of FIG. 13) are formed in an organic light-emitting display device (refer to 10 of FIG. 13). That is, the spacer 152 or 152'a is formed to be adjacent to or to contact the area where the non-emission unit such as the pixel defining layer is formed, and thus, the light-emission unit is not damaged even if the spacer 152 or 152'a contacts the substrate 500.

In one embodiment, the spacer 152 or 152'a may have a thickness "d" of about 60 μm or less. In one embodiment, if a maximum distance between the substrate 500 and the patterning slit sheet 150 or 150' is about 100 μm, the thickness of the spacer 152 or 152'a may be formed to be 60 μm or less to be slightly less than the distance between the substrate 500 and the patterning slit sheet 150 or 150' such that the light-emission unit is not damaged even if the spacer 152 or 152'a contacts the substrate 500 when the organic layer deposition assembly 100 or the substrate 500 is moved relative to each other to perform the deposition.

Although not shown in FIGS. 5 and 6, a magnet having a weak magnetic force may be inserted in the electrostatic chuck 600 that moves the substrate 500 so as to pull the spacer 152 or 152'a of the patterning slit sheet 150 or 150'. Through the above-described structure, sagging of the patterning slit sheet 150 or 150' may be prevented or substantially prevented, and the distance between the patterning slit sheet 150 or 150' and the substrate 500 may be maintained constant.

Figure 7:
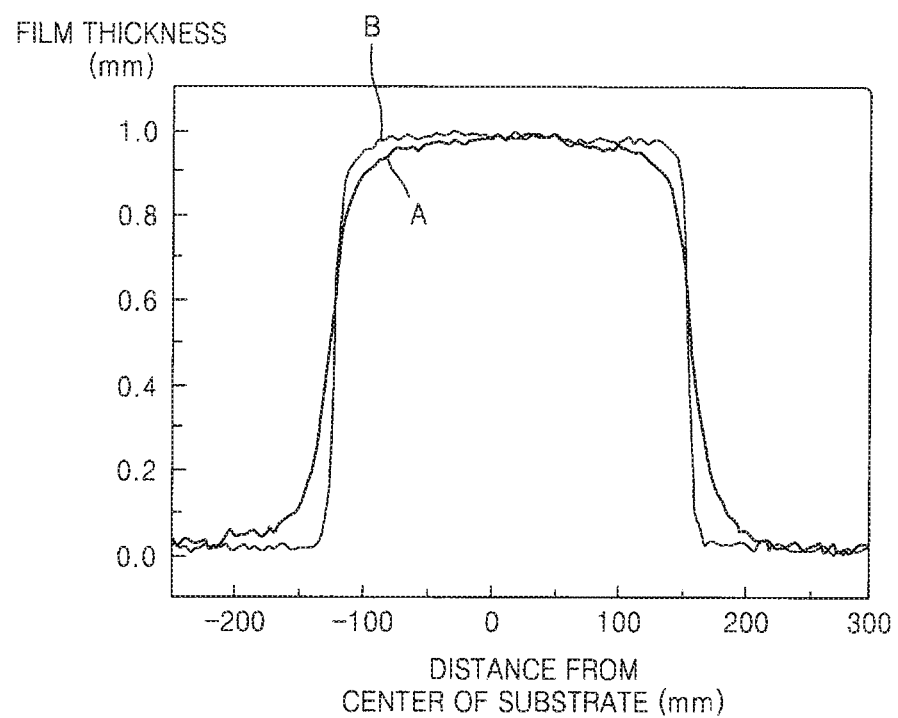
FIG. 7 is a graph illustrating distribution patterns of an organic layer formed on a substrate when a spacer is formed and when a spacer is not formed in an organic layer deposition apparatus according to an embodiment of the present invention.

FIG. 7 is a graph schematically illustrating distribution patterns of an organic layer formed on a substrate when a spacer is formed and when a spacer is not formed in an organic layer deposition apparatus according to an embodiment of the present invention. In FIG. 7, the line "A" denotes a distribution pattern of the organic layer formed on the substrate when the spacer is not formed, and the line "B" denotes the distribution pattern of the organic layer formed on the substrate when the spacer is formed in the organic layer deposition apparatus. When comparing line "A" and line "B" with each other, the organic layer is formed nearly perpendicular to the substrate when the spacer is formed (line "B"), illustrating that the infiltration of the organic layer to adjacent pixels may be prevented or substantially prevented.

As described above, the formation of shadow on the substrate 500 may be prevented or substantially prevented according to an embodiment of the present invention, and thus, the color mixture that is caused by the infiltration of the organic material to adjacent pixels may be prevented or substantially prevented. In addition, the distance between the organic light-emitting display device and the patterning slit sheet may be maintained constant by the spacer, and thus, scratches on the organic light-emitting display device by the patterning slit sheet, which may be generated during aligning the organic light-emitting display device and the patterning slit sheet, may be prevented or substantially prevented, thereby improving manufacturing yield of the product.

Figure 8:
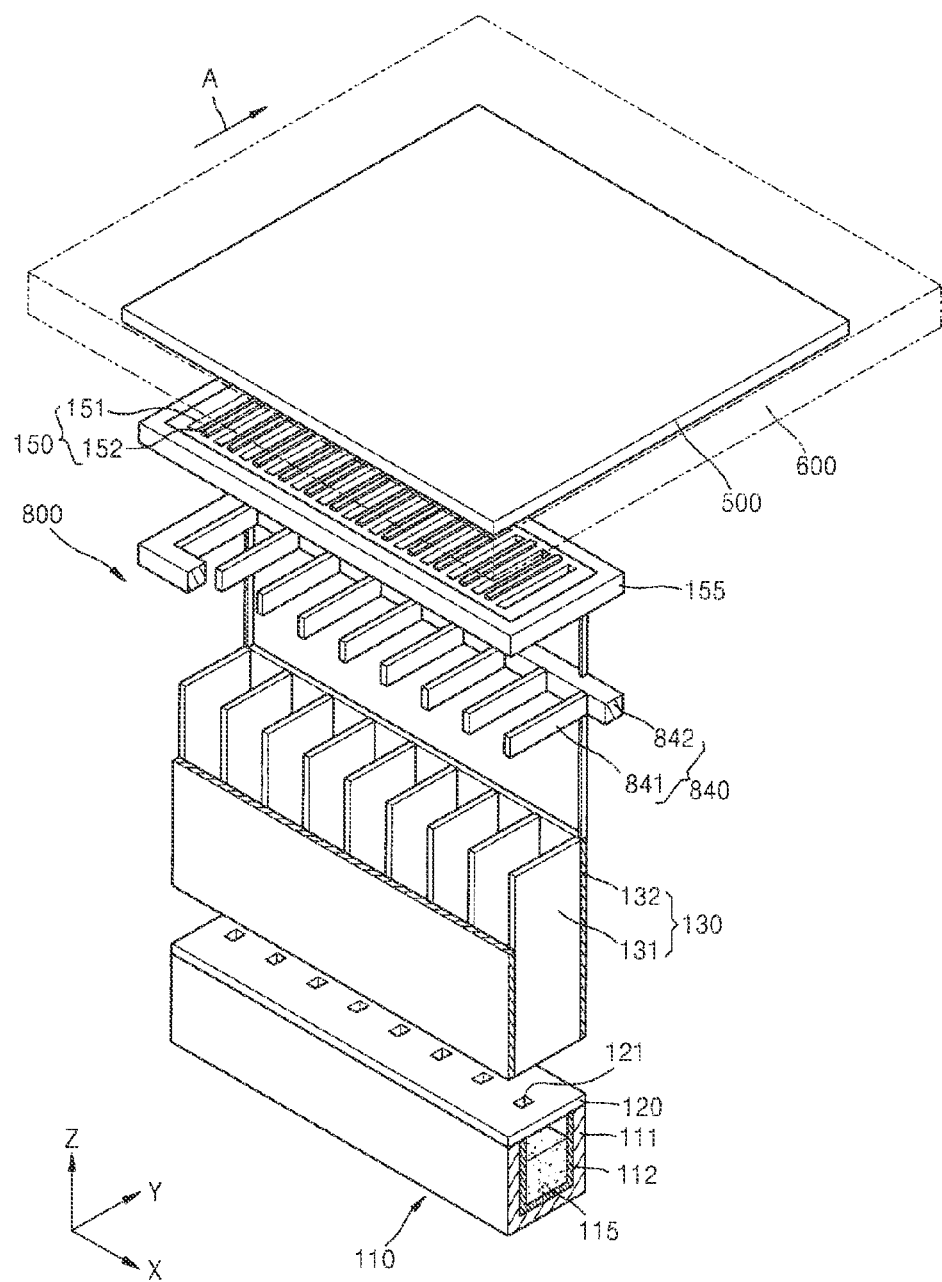
FIG. 8 is a schematic perspective view of an organic layer deposition assembly according to another embodiment of the present invention.

FIG. 8 is a schematic perspective view of an organic layer deposition assembly according to another embodiment of the present invention.

Referring to FIG. 8, the organic layer deposition assembly 800 according to another embodiment of the present invention includes the deposition source 110, the deposition source nozzle unit 120, the first barrier plate assembly 130, a second barrier plate assembly 840, and the patterning slit sheet 150. Structures of the deposition source 110, the deposition source nozzle unit 120, the first barrier plate assembly 130, and the patterning slit sheet 150 may be the same as those of the organic layer deposition assembly 100 described above, and thus description thereof will not be repeated. The organic layer deposition assembly 800 differs from the organic layer deposition assembly 100 described above in that the second barrier plate assembly 840 is disposed at a side of the first barrier plate assembly 130.

The second barrier plate assembly 840 includes a plurality of second barrier plates 841, and a second barrier plate frame 842 that covers sides of the second barrier plates 841. The plurality of second barrier plates 841, in one embodiment, may be arranged parallel to each other at intervals (e.g., equal intervals) in the X-axis direction. In addition, each of the second barrier plates 841 may be formed to extend in the Y-Z plane (i.e. perpendicular to the X-axis direction), as shown in FIG. 8.

The plurality of first barrier plates 131 and the second barrier plates 841 arranged as described above partition the space between the deposition source nozzle unit 120 and the patterning slit sheet 150. The deposition space is divided by the first barrier plates 131 and the second barrier plates 841 into sub-deposition spaces that respectively correspond to the deposition source nozzles 121 through which the deposition material 115 is discharged.

The second barrier plates 841 may be disposed to correspond respectively to the first barrier plates 131. The second barrier plates 841 may be respectively aligned with the first barrier plates 131 to be parallel thereto and on the same plane as the first barrier plates 131. Each pair of the corresponding first and second barrier plates 131 and 841 may be located on the same plane. Although the first barrier plates 131 and the second barrier plates 841 are respectively illustrated as having the same thickness in the X-axis direction, aspects of the present invention are not limited thereto. In other words, the second barrier plates 841, which are aligned with the patterning slits 151, may be formed to be relatively thin, whereas the first barrier plates 131, which do not need to be as accurately aligned with the patterning slits 151, may be formed to be relatively thick. This simplifies manufacturing of the organic layer deposition assembly.

Figure 9:
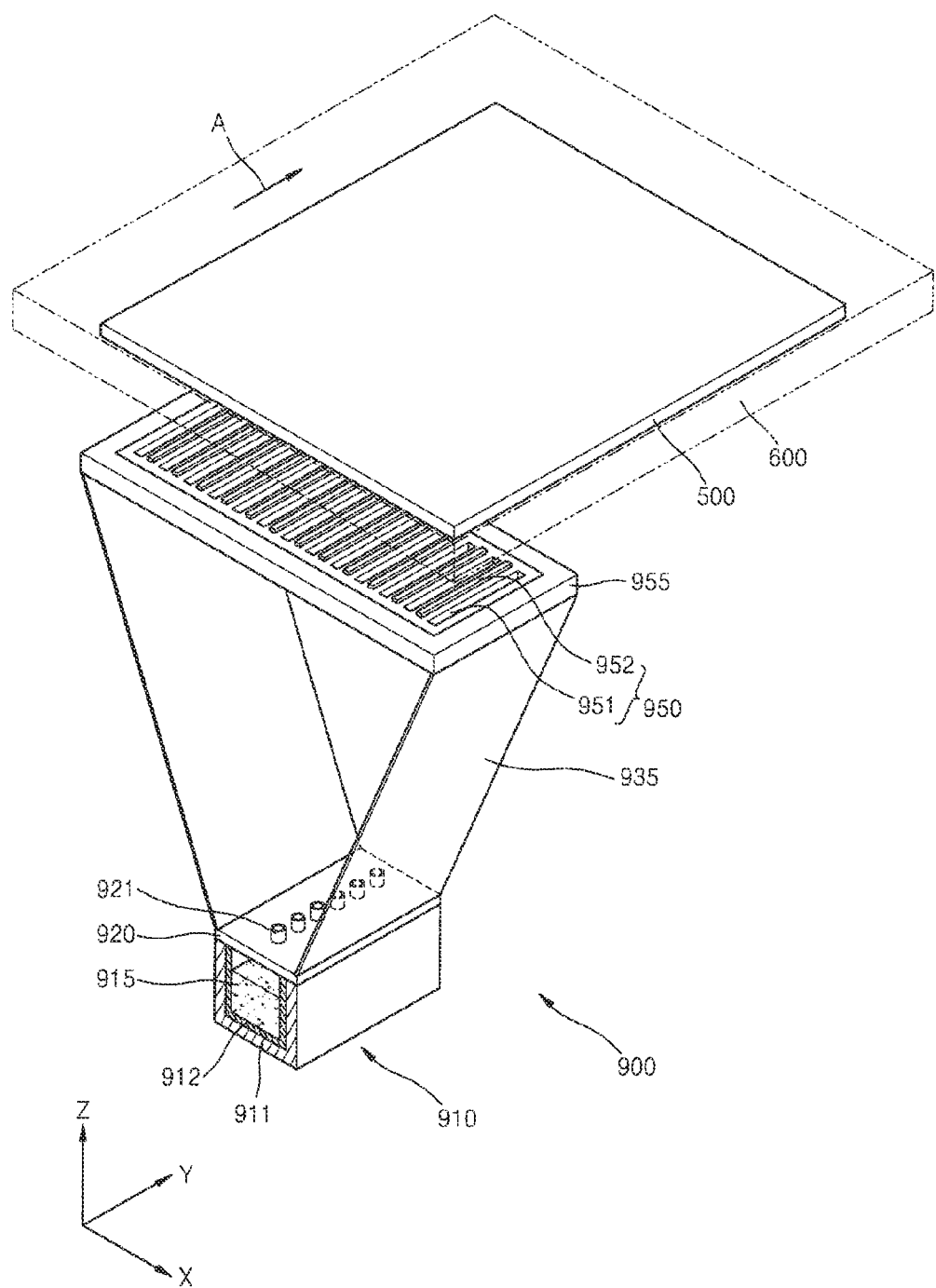
FIG. 9 is a schematic perspective view of an organic layer deposition assembly according to another embodiment of the present invention.

FIG. 9 is a schematic perspective view of an organic layer deposition assembly 900 according to another embodiment of the present invention.

Referring to FIG. 9, the organic layer deposition assembly 900 according to another embodiment of the present invention includes a deposition source 910, a deposition source nozzle unit 920, and a patterning slit sheet 950.

In one embodiment, the deposition source 910 includes a crucible 911 that is filled with a deposition material 915, and a heater 912 that heats the crucible 911 to vaporize the deposition material 915 which is contained in the crucible 911, so as to move the vaporized deposition material 915 to the deposition source nozzle unit 920. The deposition source nozzle unit 920 is disposed at a side of the deposition source 910. The deposition source nozzle unit 920 includes a plurality of deposition source nozzles 921 arranged in the Y-axis direction. The patterning slit sheet 950 and a frame 955 are disposed between the deposition source 910 and the substrate 500. The patterning slit sheet 950, in one embodiment, includes a plurality of patterning slits 951 and a plurality of spacers 952 arranged in the X-axis direction. In one embodiment, the deposition source 910 and the deposition source nozzle unit 920 may be connected to the patterning slit sheet 950 by a connection member 935.

In the organic layer deposition assembly 900 according to an embodiment of the present invention, arrangement of the plurality of deposition source nozzles 921 included in the deposition source nozzle unit 920 is different from those of the previously described embodiments, and therefore will be described in further detail below.

The deposition source nozzle unit 920 is disposed at a side of the deposition source 910, and, in particular, at the side of the deposition source 910 facing the substrate 500. The deposition source nozzle unit 920 includes the plurality of deposition source nozzles 921 arranged at intervals (e.g., equal intervals) in the Y-axis direction (i.e. a scanning direction of the substrate 500). The deposition material 915 that is vaporized in the deposition source 910 passes through the deposition source nozzle unit 920 toward the substrate 500 which constitutes a deposition target. As described above, when the deposition source nozzle unit 920 includes the plurality of deposition source nozzles 921 arranged in the Y-axis direction, that is, the scanning direction of the substrate 500, the size of a pattern formed of the deposition material 915 discharged through the patterning slits 951 of the patterning slit sheet 950 is affected by the size of one of the deposition source nozzles 921 since there is only one line of deposition nozzles in the X-axis direction, and thus no shadow zone may be formed on the substrate 500. In one embodiment, since the plurality of deposition source nozzles 921 are arranged in the scanning direction of the substrate 500, even if there is a difference in flux between the deposition source nozzles 921, the difference may be compensated for and deposition uniformity may be maintained constant. In the organic layer deposition assembly 900, the barrier plate assembly that is included in the organic layer deposition assembly 100 described above may be omitted, and the deposition material is not deposited on the barrier plate assembly, and thus, a usage efficiency of the deposition material may be improved.

Figure 10:
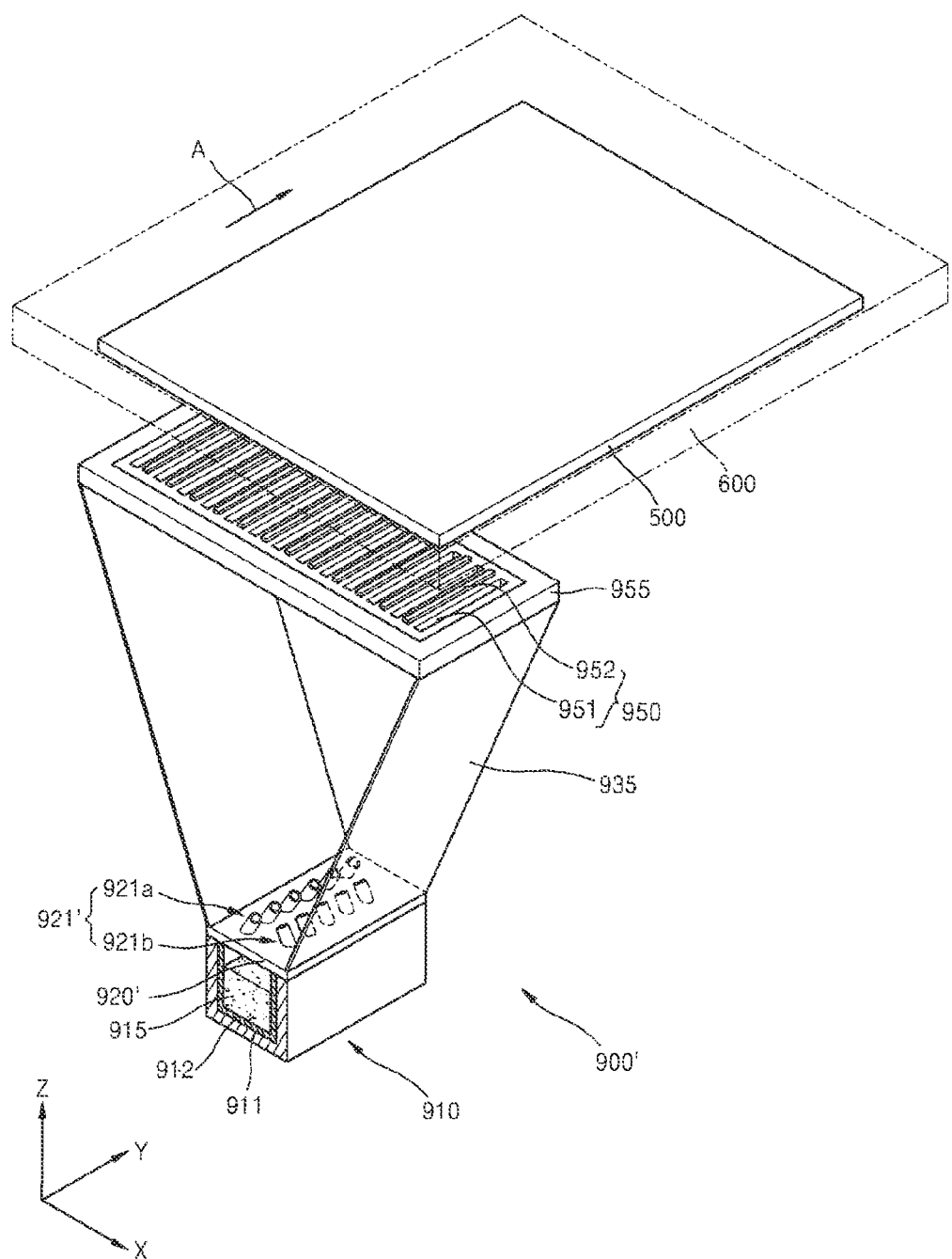
FIG. 10 is a schematic perspective view of an organic layer deposition assembly according to another embodiment of the present invention.

FIG. 10 is a schematic perspective view of an organic layer deposition assembly 900' according to another embodiment of the present invention. Referring to FIG. 10, the organic layer deposition assembly 900' according to another embodiment of the present invention includes the deposition source 910, a deposition source nozzle unit 920, and the patterning slit sheet 950.

In one embodiment, a plurality of deposition source nozzles 921 formed in the deposition source nozzle unit 920' are tilted at a predetermined angle, unlike in the organic layer deposition assembly 900 described above with reference to FIG. 9. In one embodiment, the deposition source nozzles 921' include deposition source nozzles 921a and 921b arranged in respective rows. The deposition source nozzles 921a and 921b may be arranged in respective rows to alternate in a zigzag pattern. The deposition source nozzles 921a and 921b may be tilted by a predetermined angle with respect to an X-Z plane.

According to one embodiment of the present invention, the deposition source nozzles 921a and 921b are arranged to be tilted by a predetermined angle with respect to each other. The deposition source nozzles 921a of a first row and the deposition source nozzles 921b of a second row may be tilted to face each other, or toward one another. In one embodiment, the deposition source nozzles 921a of the first row in a left part of the deposition source nozzle unit 920' may be tilted to face a right side portion of the patterning slit sheet 950, and the deposition source nozzles 921b of the second row in a right part of the deposition source nozzle unit 920' may be tilted to face a left side portion of the patterning slit sheet 950.

Due to the structure of the organic layer deposition assembly 900' according to one embodiment, the deposition of the deposition material 915 may be adjusted to lessen a thickness variation between the center and the end portions of the substrate 500 and improve thickness uniformity of the deposition film. Moreover, utilization efficiency of the deposition material 915 may also be improved.

Figure 11:
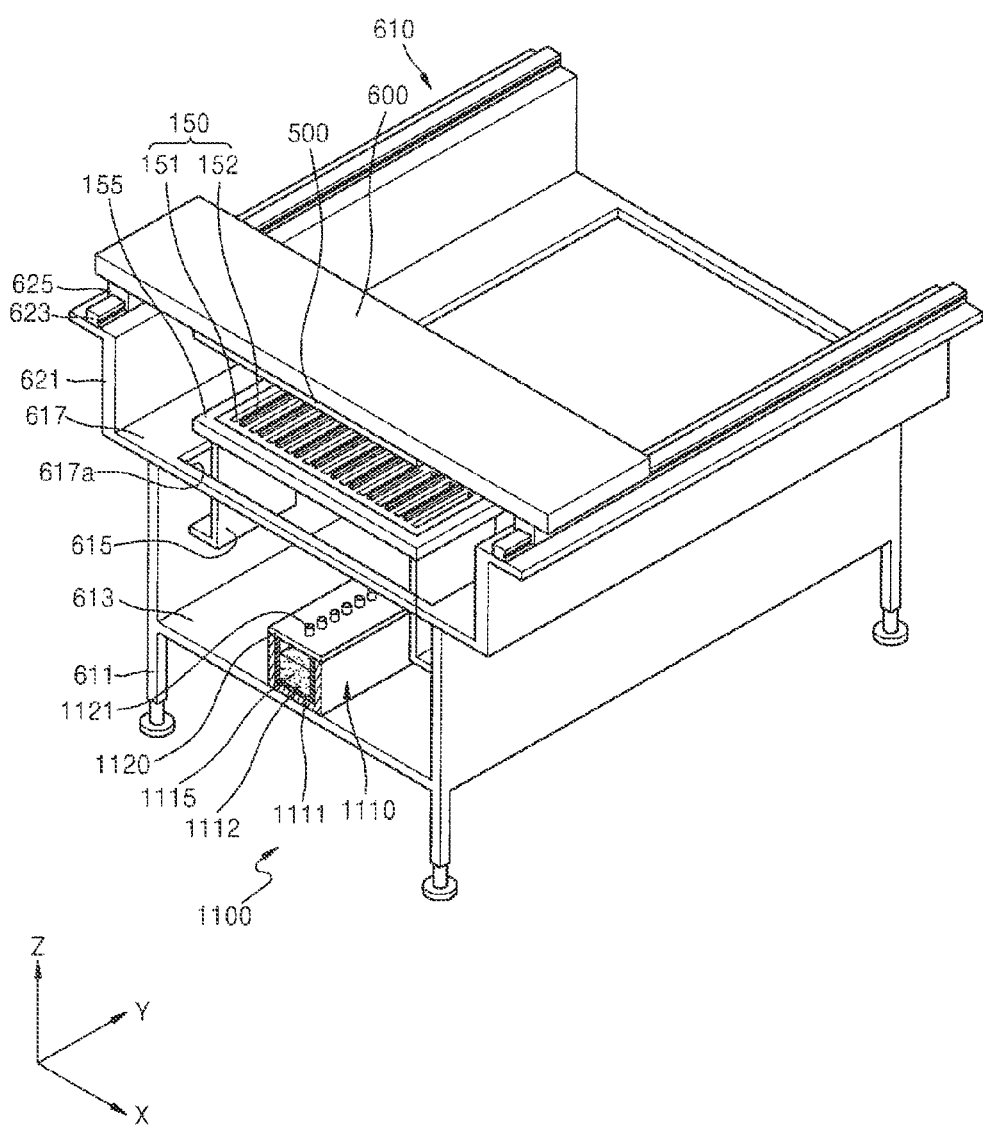
FIG. 11 is a schematic perspective view of an organic layer deposition assembly according to another embodiment of the present invention.
Figure 12:
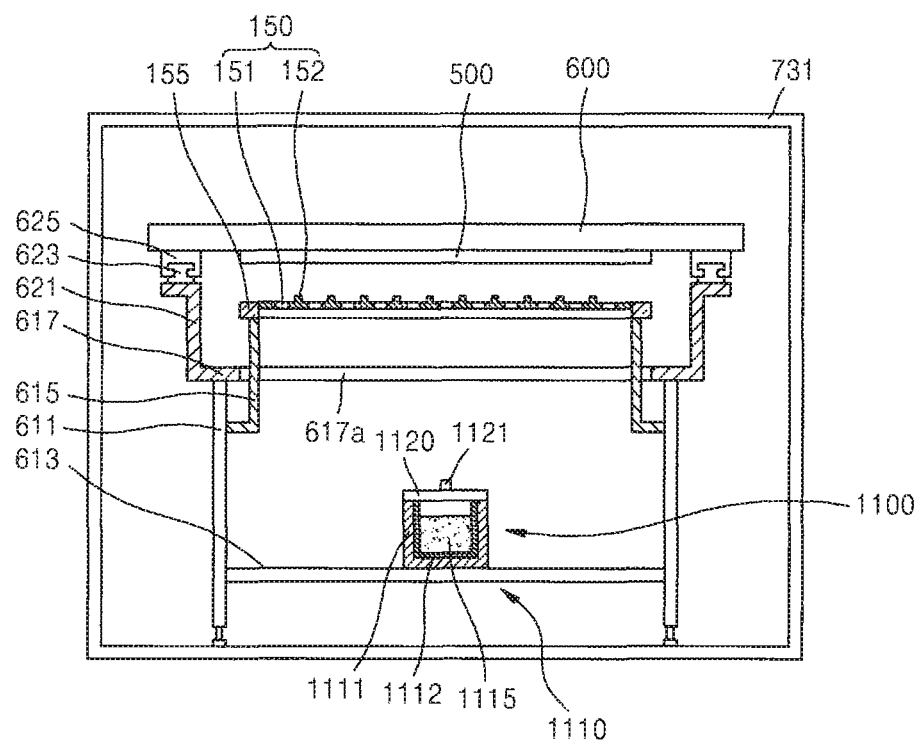
FIG. 12 is a schematic front view of the organic layer deposition assembly of FIG. 11.

FIG. 11 is a schematic perspective view of a first conveyor unit and a first organic layer deposition assembly, such as in the organic layer deposition apparatus of FIG. 1, and FIG. 12 is a schematic front view of the first conveyor unit and the first organic layer deposition assembly shown in FIG. 11. A first chamber is omitted in FIG. 11 for purposes of illustration.

Referring to FIGS. 11 and 12, the organic layer deposition apparatus according to an embodiment of the present invention includes an organic layer deposition assembly 1100 including a first conveyor unit and a deposition unit, such as the first conveyor unit 610 and the deposition unit 730 described above and shown in FIG. 1.

The organic layer deposition assembly 1100 according to an embodiment of the present invention includes a deposition source 1110, a deposition source nozzle unit 1120, and the patterning slit sheet 150. In one embodiment, the deposition source 1110 includes a crucible 1111 that is filled with a deposition material 1115, and a heater 1112 that heats the crucible 1111 to vaporize the deposition material 1115 which is contained in the crucible 1111, so as to move the vaporized deposition material 1115 to the deposition source nozzle unit 1120. The deposition source nozzle unit 1120 which, in one embodiment, has a planar shape, is disposed at a side of the deposition source 1110. The deposition source nozzle unit 1120 includes a plurality of deposition source nozzles 1121 arranged in the Y-axis direction. The patterning slit sheet 150 and the frame 155 are further disposed between the deposition source 1110 and the substrate 500. The patterning slit sheet 150 includes the plurality of patterning slits 151 and the plurality of spacers 152 arranged in the X-axis direction. According to an embodiment of the present invention, the deposition source 1110, the deposition source nozzle unit 1120, and the patterning slit sheet 150 are formed as separate members in the deposition unit 730, not as an integral member. This will be described in further detail later herein.

The first conveyor unit 610 is described in further detail below.

The first conveyor unit 610 moves the electrostatic chuck 600 on which the substrate 500 is fixed. In one embodiment, the first conveyor unit 610 includes a frame 611 including a lower plate 613 and an upper plate 617, a sheet supporting member 615 formed in the frame 611, a guide supporting member 621 formed on an upper portion of the frame 611, a pair of guide rails 623 formed on the guide supporting member 621, and a plurality of guide blocks 625 formed on the pair of guide rails 623.

The frame 611, in one embodiment, constitutes a base of the first conveyor unit 610, and is formed having a generally empty box shape. In one embodiment, the lower plate 613 forms a lower surface of the frame 611, and the deposition source 1110 may be disposed on the lower plate 613. The upper plate 617 may form an upper surface of the frame 611, and may include an opening 617a such that the deposition material 1115 vaporized in the deposition source 1110 may pass through the patterning slit sheet 150 to be deposited on the substrate 500. The components of the frame 611 may be formed as separate members subsequently coupled to one another, or may be formed integrally with each other.

Although not shown in FIGS. 11 and 12, the lower plate 613 on which the deposition source 1110 is disposed may be formed as a cassette-type that may be drawn from the frame 611. Thus, the deposition source 1110 may be easily replaced.

In one embodiment, the sheet supporting member 615 may protrude from an inner side surface of the frame 611 to support the patterning slit sheet 150. The sheet supporting member 615 may guide the deposition material 1115 which is discharged through the deposition source nozzles 1121 to move straight, not to flow in the X-axis direction.

As described above, the electrostatic chuck 600 on which the substrate 500 is fixed may be linearly moved to perform the deposition. In this case, the electrostatic chuck 600 may be moved by a device, such as a roller or a conveyor, for example, or by using a linear motion system that includes the guide rail 623 and the guide block 625 for precisely conveying the substrate 500, as shown in FIGS. 11 and 12.

In one embodiment, the guide supporting member 621 formed on the upper plate 617 and the pair of guide rails 623 formed on the guide supporting member 621 are installed to penetrate through the first chamber 731 of the deposition unit 730.

An upper portion of the guide supporting member 621 may be formed as flat plane, and the pair of guide rails 623 may be formed on the upper surface of the guide supporting member 621. The guide block 625 may be inserted in the guide rails 623 such that the guide block 625 reciprocates along the guide rails 623.

The guide block 625 may include a driving unit (not shown). The driving unit of the guide block 625 may be configured for moving the guide block 625 along the guide rails 623. The driving unit may itself generate a driving force, or may transfer a driving force applied from an additional driving source to the guide block 625.

A predetermined linear motion (LM) system may be constituted by using the guide rails 623 as LM rails and the guide block 625 as an LM block. The LM system is a conveying system having a very high positioning accuracy due to a small frictional coefficient and small positioning error when compared to a conventional sliding guide system. A detailed description of the LM system is not provided herein.

As described above, according to embodiments of the present invention, a mask is formed to be smaller than a substrate, and deposition is performed while the mask is moved relative to the substrate. Thus, the mask can be easily manufactured. In addition, defects caused due to contact between a substrate and a FMM, which occur in the conventional deposition method, may be prevented or substantially prevented. In addition, since it is unnecessary to contact the substrate with the mask during the deposition process, the manufacturing speed may be improved.

In addition, the deposition source 1110, the deposition source nozzle unit 1120, and the patterning slit sheet 150 of the organic layer deposition assembly 1100 are formed as separate members in the deposition source 730, not as an integral member. According to the above-described structure, inserting and drawing operations of the deposition source 1110 for filling the deposition material 1115 in the deposition source 1110 and inserting and drawing operations of the patterning slit sheet 150 for performing a cleaning or a replacing process may be easily performed.

FIG. 13 is a schematic cross-sectional view of an active matrix organic light-emitting display device fabricated by using an organic layer deposition apparatus, according to an embodiment of the present invention.

Referring to FIG. 13, an active matrix organic light-emitting display device 10 according to an embodiment of the present invention is formed on a substrate 30. The substrate 30 may be formed of a transparent material, such as glass, plastic, or metal. An insulating layer 31, such as a buffer layer, is formed on an entire surface of the substrate 30.

In one embodiment, a thin film transistor (TFT) 40, a capacitor 50, and an organic light-emitting diode (OLED) 60 are disposed on the insulating layer 31, as illustrated in FIG. 13.

In one embodiment, a semiconductor active layer 41 is formed on an upper surface of the insulating layer 31 in a predetermined pattern, and a gate insulating layer 32 is formed to cover the semiconductor active layer 41. The semiconductor active layer 41 may include a p-type or n-type semiconductor material.

A gate electrode 42 of the TFT 40 may be formed in a region of the gate insulating layer 32 corresponding to the semiconductor active layer 41, and an interlayer insulating layer 33 may be formed to cover the gate electrode 42. The interlayer insulating layer 33 and the gate insulating layer 32 may be etched, for example (e.g., by dry etching) to form a contact hole exposing parts of the semiconductor active layer 41.

In one embodiment, a source/drain electrode 43 is formed on the interlayer insulating layer 33 to contact the semiconductor active layer 41 through the contact hole, and a passivation layer 34 is formed to cover the source/drain electrode 43, and is etched, for example, to expose a part of the drain electrode 43. An insulating layer (not shown) may be further formed on the passivation layer 34 so as to planarize the passivation layer 34.

In addition, the OLED 60 displays predetermined image information by emitting red, green, or blue light as current flows. The OLED 60 includes a first electrode 61 disposed on the passivation layer 34. The first electrode 61 is electrically connected to the drain electrode 43 of the TFT 40.

A pixel defining layer 35 is formed to cover the first electrode 61. An opening is formed in the pixel defining layer 35, and then an organic layer 63, including an emission layer, is formed in a region defined by the opening. A second electrode 62 is formed on the organic layer 63.

In one embodiment, the pixel defining layer 35, which defines individual pixels, is formed of an organic material. The pixel defining layer 35 also planarizes the surface of a region of the substrate 30 where the first electrode 61 is formed, and in particular, the surface of the passivation layer 34.

The first electrode 61 and the second electrode 62 are insulated from each other, and respectively apply voltages of opposite polarities to the organic layer 63, including the emission layer, to induce light emission.

The organic layer 63 including the emission layer may be formed of a low-molecular-weight organic material or a high-molecular-weight organic material. When a low-molecular-weight organic material is used, the organic emission layer 63 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials may include copper phthalocyanine (CuPc), N,N'-di(naphthalene-1-yl)-N,N'-diphenyl-benzidine (NPB), tris-8-hydroxyquinoline aluminum (Alq3), and the like.

After the organic layer 63 is formed, the second electrode 62 may be formed by the same deposition method as used to form the organic layer 63.

The first electrode 61 may function as an anode, and the second electrode 62 may function as a cathode. Alternatively, the first electrode 61 may function as a cathode, and the second electrode 62 may function as an anode. The first electrode 61 may be patterned to correspond to individual pixel regions, and the second electrode 62 may be formed to cover all the pixels.

The first electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$), for example. Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr), or a compound thereof, for example, and forming a layer of ITO, IZO, ZnO, or $In_2O_3$ on the reflective layer. The first electrode 61 may be formed by forming a layer, such as by sputtering, for example, and then patterning the layer (e.g., by photolithography).

The second electrode 62 may also be formed as a transparent electrode or a reflective electrode. In one embodiment, when the second electrode 62 is formed as a transparent electrode, the second electrode 62 functions as a cathode. Such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the intermediate layer 63 and forming an auxiliary electrode layer or a bus electrode line thereon from ITO, IZO, ZnO, $In_2O_3$, or the like. When the second electrode 62 is formed as a reflective electrode, the reflective layer may be formed by depositing Li, Ca, LiF/Ca, LiF/Al, Al, Ag, Mg, or a compound thereof on the entire surface of the organic layer 63. The second electrode 62 may be formed by using the same deposition method as used to form the organic layer 63 including the emission layer described above.

The organic layer deposition apparatus according to embodiments of the present invention described above may be applied to form an organic layer or an inorganic layer of an organic TFT, and to form layers from various materials.

As described above, in an organic layer deposition apparatus according to embodiments of the present invention, and in a method of manufacturing an organic light-emitting display device by using the organic layer deposition apparatus according to embodiments of the present invention, the organic layer deposition apparatus may be easily manufactured, and may be simply applied to the manufacture of large-sized display devices on a mass scale. In addition, the organic layer deposition apparatus and the organic light-emitting display device according to embodiments of the present invention may be easily manufactured, and may have improved manufacturing yield and deposition efficiency.

While the present invention has been particularly shown and described with reference to some exemplary embodiments thereof, it will be understood by those of ordinary skill in the art that various changes in form and details may be made therein without departing from the spirit and scope of the present invention as set forth in the following claims.

What is claimed is:

1. A method of manufacturing an organic light-emitting display device using an organic layer deposition apparatus including a deposition source, a deposition source nozzle unit arranged at a side of the deposition source and including a plurality of deposition source nozzles, and a patterning slit sheet facing the deposition source nozzle unit and including a plurality of patterning slits and a plurality of spacers arranged on an outer surface of the patterning slit sheet and protruded from the outer surface of the patterning slit sheet, the plurality of spacers including a first spacer at a first side of a patterning slit of a pair of adjacent patterning slits of the plurality of patterning slits, and a second spacer at a second side of the patterning slit, the first and second spacers being spaced apart from each other and protruded farther from the outer surface than remaining portions of the patterning slit sheet between the first and second spacers, the method comprising:

spacing a substrate that is a deposition target apart from the organic layer deposition apparatus by a distance, the substrate facing the outer surface of the patterning slit sheet, the patterning slit sheet being smaller than the substrate in at least one of a first direction or a second direction perpendicular to the first direction;

discharging a deposition material from the deposition source nozzle unit and through the plurality of patterning slits; and depositing the deposition material onto the substrate while moving at least one of the organic layer deposition apparatus or the substrate relative to the other, wherein each of the plurality of spacers protrudes to a predetermined height from the patterning slit sheet toward the substrate.

2. The method of claim 1, wherein a thickness of each of the plurality of spacers is less than or equal to the distance between the substrate and the organic layer deposition apparatus.

3. The method of claim 1, wherein the plurality of spacers comprises two spacers arranged between the pair of adjacent patterning slits, and each of the two spacers is located at a side of each of the pair of adjacent patterning slits.

4. The method of claim 1, wherein the plurality of spacers and the patterning slit sheet are integrally formed with each other.

5. The method of claim 1, wherein the patterning slit sheet comprises a patterning sheet including the plurality of patterning slits, and a spacer sheet including the plurality of spacers.

6. The method of claim 1, wherein each of the plurality of spacers is disposed to correspond to a pixel defining layer formed on the substrate.

7. The method of claim 1, wherein deposition source nozzles of the plurality of deposition source nozzles are arranged in the first direction, and patterning slits of the plurality of patterning slits are arranged in the second direction.

8. The method of claim 1,
wherein deposition source nozzles of the plurality of deposition source nozzles are arranged in the first direction, and patterning slits of the plurality of patterning slits are arranged in the first direction, and
wherein the organic layer deposition apparatus further includes a barrier plate assembly comprising a plurality of barrier plates arranged between the deposition source nozzle unit and the patterning slit sheet in the first direction and partitioning a space between the deposition source nozzle unit and the patterning slit sheet into a plurality of sub-deposition spaces.

9. The method of claim 1, wherein the organic layer deposition apparatus further includes a chamber, deposition source nozzles of the plurality of deposition source nozzles are arranged in the first direction, the patterning slit sheet is fixedly coupled to an inner side of the chamber, and patterning slits of the plurality of patterning slits are arranged in the second direction.

* * * * *